US012677481B2

(12) United States Patent
Qin et al.

(10) Patent No.: US 12,677,481 B2
(45) Date of Patent: Jul. 7, 2026

(54) ARRAY SUBSTRATE, DISPLAY PANEL AND DISPLAY APPARATUS

(71) Applicant: Hefei Visionox Technology Co., Ltd., Hefei (CN)

(72) Inventors: Shaoyang Qin, Hefei (CN); Shoukun Wang, Hefei (CN); Chengyu Zhao, Hefei (CN)

(73) Assignee: Hefei Visionox Technology Co.. Ltd., Hefei (CN)

( * ) Notice: Subject to any disclaimer, the term of this patent is extended or adjusted under 35 U.S.C. 154(b) by 371 days.

(21) Appl. No.: 18/455,780

(22) Filed: Aug. 25, 2023

(65) Prior Publication Data

US 2023/0402467 A1 Dec. 14, 2023

Related U.S. Application Data

(63) Continuation of application No. PCT/CN2022/089452, filed on Apr. 27, 2022.

(30) Foreign Application Priority Data

Sep. 15, 2021 (CN) .......................... 202111079607.X

(51) Int. Cl.
    *H10D 86/60*     (2025.01)
    *H10D 86/40*     (2025.01)

(52) U.S. Cl.
    CPC ........... *H10D 86/60* (2025.01); *H10D 86/443* (2025.01)

(58) Field of Classification Search
    CPC .... H10D 86/60; H10D 86/443; H10D 86/441; H10K 59/131
    See application file for complete search history.

(56) References Cited

U.S. PATENT DOCUMENTS

2016/0085125 A1* 3/2016 Park ....................... H10D 86/60
    349/139
2019/0051718 A1* 2/2019 Zhang .................. G09G 3/3225
(Continued)

FOREIGN PATENT DOCUMENTS

CN      108598139 A    9/2018
CN      109637372 A    4/2019
(Continued)

OTHER PUBLICATIONS

Office Action issued on Nov. 4, 2023, in corresponding Chinese Application No. 202111079607.X, 7 pages including partial English translation.

(Continued)

*Primary Examiner* — S M Sohel Imtiaz
(74) *Attorney, Agent, or Firm* — Maier & Maier, PLLC

(57) ABSTRACT

An array substrate, a display panel and a display apparatus. The array substrate includes a first region and a second region surrounding at least a part of the first region, and the array substrate includes a substrate and a plurality of metal wiring layers formed on the substrate, in which the plurality of metal wiring layers include a first metal wiring layer positioned on a side of any of other metal wiring layers away from the substrate; and orthographic projections of at least a part of the other metal wiring layers on the substrate are positioned within an orthographic projection of the first metal wiring layer on the substrate, and the first metal wiring layer is configured to compensate for a density of metal wirings.

19 Claims, 12 Drawing Sheets

(56) References Cited

U.S. PATENT DOCUMENTS

| | | | | |
|---|---|---|---|---|
| 2020/0176519 | A1* | 6/2020 | Seo | H10H 20/852 |
| 2020/0343326 | A1* | 10/2020 | Park | G09G 3/3233 |
| 2021/0066437 | A1* | 3/2021 | Ryu | H10K 59/131 |
| 2021/0165268 | A1* | 6/2021 | Yang | H10D 86/60 |
| 2021/0373394 | A1* | 12/2021 | Zhang | G02F 1/136204 |
| 2022/0157860 | A1* | 5/2022 | Zhu | H10D 86/411 |
| 2022/0199649 | A1* | 6/2022 | Xu | H10D 86/60 |

FOREIGN PATENT DOCUMENTS

| | | | |
|---|---|---|---|
| CN | 111081141 | A | 4/2020 |
| CN | 111599852 | A | 8/2020 |
| CN | 109300953 | B | 2/2021 |
| CN | 113160742 | A | 7/2021 |
| CN | 113160743 | A | 7/2021 |
| CN | 113223409 | A | 8/2021 |
| CN | 113823642 | A | 12/2021 |

OTHER PUBLICATIONS

International Search Report issued Jul. 1, 2022, in corresponding International Application No. PCT/CN2022/089452, 5 pages.

\* cited by examiner

ARRAY SUBSTRATE, DISPLAY PANEL AND DISPLAY APPARATUS

CROSS-REFERENCE TO RELATED APPLICATIONS

The present application is a continuation of International Application No. PCT/CN2022/089452 filed on Apr. 27, 2022, which claims the priority to Chinese Patent Application No. 202111079607.X filed on Sep. 15, 2021, and titled "ARRAY SUBSTRATE, DISPLAY PANEL AND DISPLAY APPARATUS", both of which are hereby incorporated by reference in their entireties.

TECHNICAL FIELD

The present application relates to a technical field of display, and particularly, to an array substrate, a display panel, and a display apparatus.

BACKGROUND

In a punched screen or an under-screen camera structure, due to existence of a hole in a region AA (Active Area) or existence of a transparent display region, signal lines around a hole region or the transparent display region cannot pass through the hole region or the transparent display region to connect with each other. Signal lines connecting different regions need to be wound around the hole region or the transparent display region, and the wound region serves as a display region of a secondary screen. However, due to existence of wound lines in the display region of the secondary screen, there is a great difference between a density of lines in the display region of the secondary screen and a density of lines in a display region of a main screen, and thus a great optical difference exists between the display region of the secondary screen and the display region of the main screen, so that a great difference exists between a display effect of the display region of the main screen and a display effect of the display region of the secondary screen after the display region of the main screen and the display region of the secondary screen are illuminated.

SUMMARY

Embodiments of the present application provide an array substrate, a display panel and a display apparatus, thereby improving a display effect.

The embodiments of a first aspect of the present application provide an array substrate. The array substrate includes a first region and a second region surrounding at least a part of the first region, and the array substrate includes a substrate and a plurality of metal wiring layers formed on the substrate, in which the plurality of metal wiring layers include a first metal wiring layer, and the first metal wiring layer is positioned on a side of any of other metal wiring layers away from the substrate; and orthographic projections of at least a part of the other metal wiring layers on the substrate are positioned within an orthographic projection of the first metal wiring layer on the substrate, and the first metal wiring layer is configured to compensate for a density of metal wirings, so that the density of the metal wirings tends to be uniform.

The embodiments of a second aspect of the present application provide a display panel including the array substrate according to any of the embodiments of the first aspect.

The embodiments of a third aspect of the present application provide a display apparatus including a display panel according to any of the embodiments of the second aspect.

In the array substrate according to the embodiments of the present application, the array substrate includes the substrate and the plurality of metal wiring layers. Herein, the first metal wiring layer is positioned on a side of any of other metal wiring layers away from the substrate. Then, under a condition that the display panel includes the array substrate, the first metal wiring layer is positioned on a side of the plurality of metal wiring layers closest to a light-emitting surface of the display panel. The orthographic projections of at least a part of the other metal wiring layers on the substrate are positioned within the orthographic projection of the first metal wiring layer on the substrate, so that metal wirings of the other metal wiring layers can be blocked by the first metal wiring layer from a display side. The first metal wiring layer is configured to compensate for the density of the metal wirings, so that the density of the metal wirings tends to be uniform, so as to reduce a display difference caused by different metal wirings positioned in different layers, thereby improving a display effect of the display panel.

BRIEF DESCRIPTION OF THE DRAWINGS

Other features, objects, and advantages of the present application will become more apparent by reading the following detailed description of non-limiting embodiments with reference to the accompanying drawings, in which the same or similar reference numerals represent the same or similar features. The accompanying drawings are not drawn to actual scale.

DETAILED DESCRIPTION

Features and exemplary embodiments of various aspects of the present application will be described in detail below. To make the objects, technical solutions and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details. The following description of the embodiments is merely to provide a better understanding of the present application by illustrating the examples of the present application.

It should be noted that relational terms such as "first" and "second" are used herein only for distinguishing one entity or operation from another entity or operation, and do not necessarily require or imply any such actual relationship or order between these entities or operations. Moreover, the terms "comprising", "including" or any other variation thereof are intended to encompass a non-exclusive inclusion, such that a process, a method, an article or a device including a series of elements not only includes these elements, but also includes other elements not explicitly listed or elements inherent to the process, the method, the article or the device. Without further limitation, an element preceded by "comprising . . . " and "including . . . " does not exclude the presence of additional similar elements in a process, a method, an article or a device including the element.

It should be noted that when a structure of a component is described, a layer/region being referred to as "above" or "over" another layer/region may mean that the layer/region is directly above or over the other layer/region, or that there may be other layer(s)/region(s) between the layer/region and the other layer/region. Moreover, if the component is turned over, the layer/region will be "under" or "below" the other layer/region.

Figure 1:
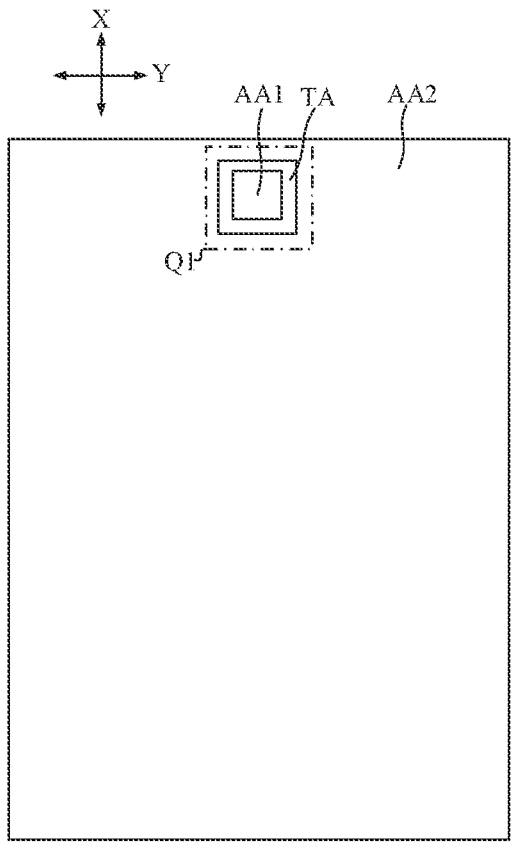
FIG. 1 is a top view of an array substrate according to embodiments of a first aspect of the present application.

FIG. 1 shows a top view of an array substrate according to embodiments of the present application.

As shown in FIG. 1, the embodiments of the present application provide an array substrate including a first region AA1 and a second region TA surrounding at least a part of the first region AA1. Optionally, the array substrate may further include a third region AA2 surrounding at least part of the second region TA.

In an example, the first region AA1 may correspond to a region where a photosensitive component is placed. The photosensitive component may be an image capturing apparatus configured to capture external image information. For example, the photosensitive component is a camera or the like. The photosensitive component may not be limited to an image capturing apparatus, for example, in some embodiments, the photosensitive component may be a light sensor such as an infrared sensor, a proximity sensor, an infrared lens, a flood sensing element, an ambient light sensor, and a dot matrix projector. The first region AA1 may be used for display, and under a condition that the display panel includes the array substrate, sub-pixels used for display are arranged within the first region AA1 of the display panel. Alternatively, the first region AA1 is a punched region, and under a condition that the display panel includes the array substrate, sub-pixels are not arranged within the first region AA1 of the display panel.

The first region AA1 may be a rectangular region, a circular region, an elliptical region or a square region, and the like, and a shape of the first region AA1 may be set according to actual requirements, which is not limited in the present application.

Optionally, the second region TA may be used for display, and under a condition that the display panel includes the array substrate, sub-pixels used for display are arranged within the second region TA of the display panel. Alternatively, the second region TA may be a wiring region, and under a condition that the display panel includes the array substrate, sub-pixels may be or may not be arranged within the second region TA of the display panel.

In some embodiments, under a condition that the display panel includes the array substrate, the display panel includes first sub-pixels arranged within the first region AA1, transition sub-pixels arranged within the second region TA and second sub-pixels arranged within the third region AA2. The array substrate has a first pixel circuit arranged to drive the first sub-pixels, a transition pixel circuit arranged to drive the transition sub-pixels and a second pixel circuit arranged to drive the second sub-pixels, the first pixel circuit is arranged within the second region TA, and signal lines electrically connected to the first pixel circuit are also arranged within the second region TA.

In some embodiments, under a condition that the display panel includes the array substrate, the first region AA1 is the punched region, and the display panel includes transition sub-pixels arranged within the second region TA and second sub-pixels arranged within the third region AA2. The array substrate has a transition pixel circuit arranged to drive the transition sub-pixels and a second pixel circuit arranged to drive the second sub-pixels, connection lines arranged to connect signal lines separated by the first region AA1 are also arranged within the second region TA.

Figure 2:
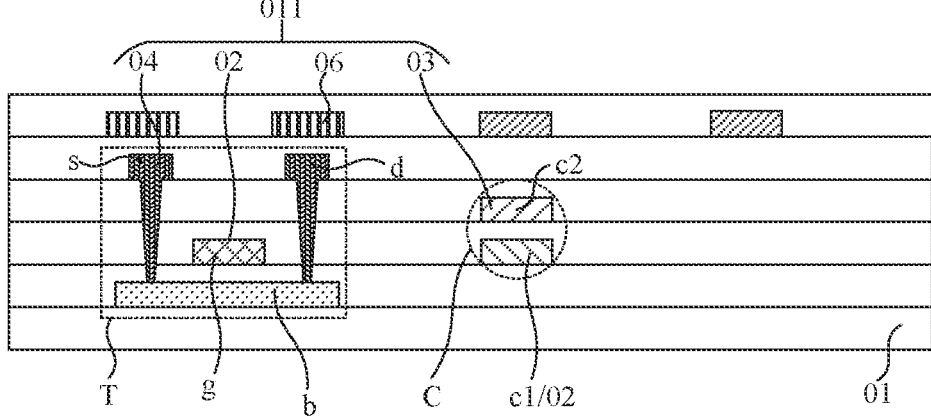
FIG. 2 is a partial cross-sectional view of an array substrate in an embodiment.

With reference to FIG. 1 and FIG. 2, in which FIG. 2 is a partial cross-sectional view of the array substrate in FIG. 1.

As shown in FIG. 2, in some embodiments, the array substrate includes a substrate 01 and a plurality of metal wiring layers 011 formed on the substrate 01, the plurality of metal wiring layers 011 include a first metal wiring layer 06, and the first metal wiring layer 06 is positioned on a side of any of other metal wiring layers away from the substrate 01; and orthographic projections of at least a part of the other metal wiring layers on the substrate 01 are positioned within an orthographic projection of the first metal wiring layer 06 on the substrate 01, and the first metal wiring layer 06 is configured to compensate for a density of the metal wirings, so that the density of the metal wirings tends to be uniform, that is, the first metal wiring layer 06 is configured to compensate for uniformity of the density of the metal wirings.

In the array substrate according to the embodiments of the present application, the array substrate includes the substrate 01 and the plurality of metal wiring layers 011. The first metal wiring layer 06 is positioned on a side of any of other metal wiring layers away from the substrate 01. Under a condition that the display panel includes the array substrate, the first metal wiring layer 06 is positioned on a side of the plurality of metal wiring layers 011 closest to a light-emitting surface of the display panel. The orthographic projections of at least a part of the other metal wiring layers on the substrate 01 are positioned within the orthographic projection of the first metal wiring layer 06 on the substrate 01, so that along a direction perpendicular to a plane where the substrate 01 is positioned, the first metal wiring layer 06 can block metal wirings in the other metal wiring layers. The first metal wiring layer 06 is configured to compensate for a density of metal lines, so that the density of the metal lines tends to be uniform. Accordingly, a display difference caused by different metal wirings positioned on different layers is reduced, thereby improving a display effect of the display panel.

Figure 3:
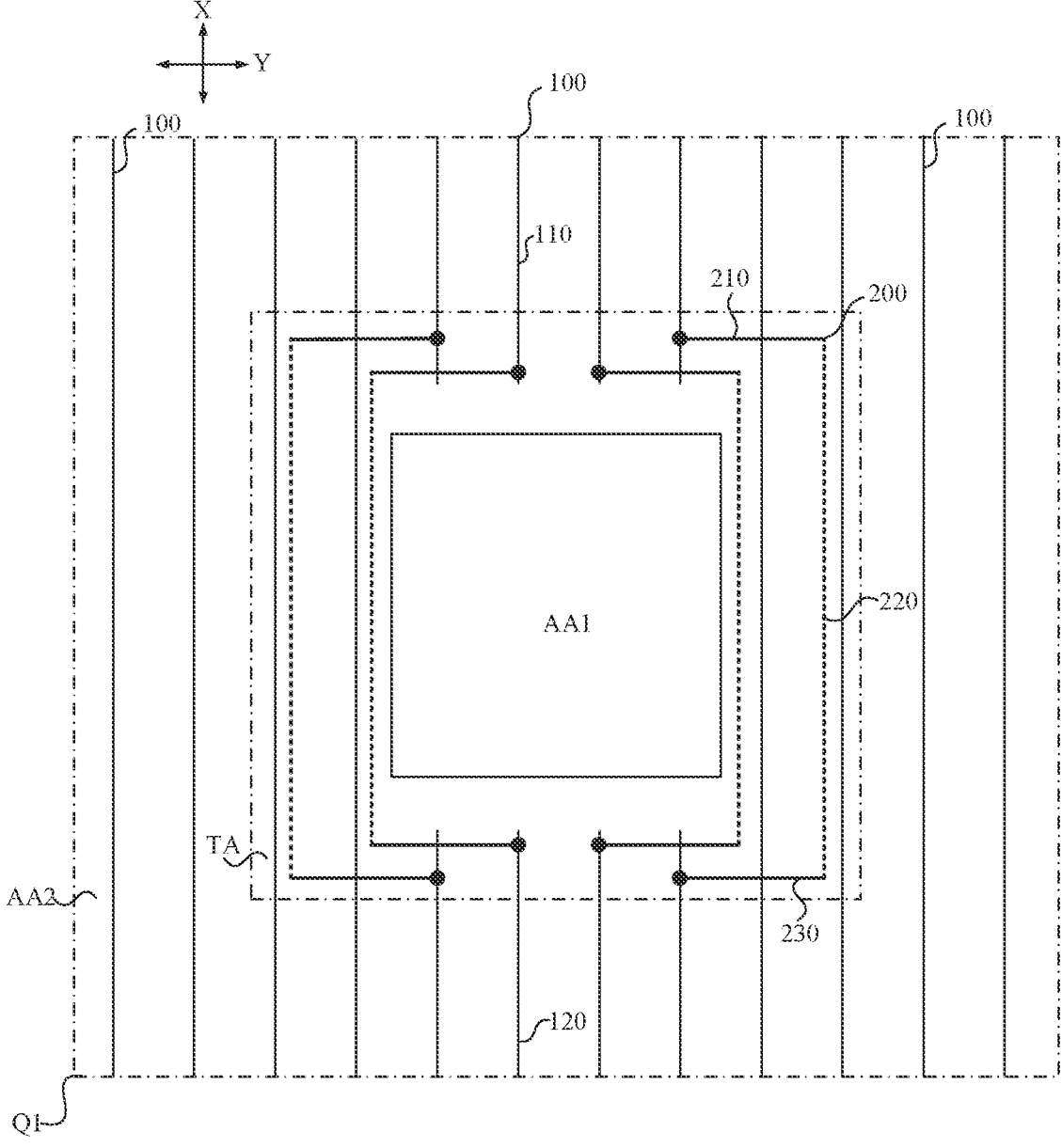
FIG. 3 is an enlarged schematic view of the region Q1 in FIG. 1 in an embodiment.

With reference to FIG. 1 to FIG. 3, in which FIG. 3 is a partial enlarged schematic view of the region Q1 in FIG. 1.

As shown in FIG. 1 to FIG. 3, in some optional embodiments, other metal wiring layers in the metal wiring layers 011 include: a plurality of first signal lines 100, in which at least one of the first signal lines 100 includes a first segment 110 and a second segment 120 separated by the first region AA1 and extending along a first direction X; a plurality of first connection lines 200 positioned in the second region TA, in which the first connection lines 200 are arranged around the first region AA1 and the first connection line 200 includes a first connection segment 210, a second connection segment 220 and a third connection segment 230 connected in sequence, the first connection segment 210 is electrically connected to the first segment 110, the second connection segment 220 is connected between the first connection segment 210 and the third connection segment 230, the third connection segment 230 is electrically connected to the second segment 120, the second connection segment 220 extends along the first direction X, and the first connection segment 210 and the third connection segment 230 both extend along a second direction Y.

Optionally, a part of the first signal lines 100 of the array substrate are positioned in the second region TA and the third region AA2, and are formed integrally and extend along the first direction X, that is, the first signal lines 100 positioned in the second region TA and the third region AA2 are not separated into two segments by the first region AA1, or a part of the first signal lines 100 are positioned on two sides of the first region AA1 along the second direction Y.

In an example, as shown in FIG. 2, the array substrate 100 may include a fifth metal wiring layer 02, a fourth metal wiring layer 03, a third metal wiring layer 04, and a first metal wiring layer 06 which are arranged on a side of the substrate 01 and are stacked. The fifth metal wiring layer 02, the fourth metal wiring layer 03, and the third metal wiring layer 04 are the other metal wiring layers in the metal wiring layers 011. Insulating layers are arranged between adjacent metal wiring layers 011. In an example, a driving circuit arranged on the array substrate includes a transistor T and a storage capacitor C. The transistor T includes a semiconductor layer b, a gate g, a source s and a drain d. The storage capacitor C includes a first plate c1 and a second plate c2. As an example, the gate g and the first plate c1 may be positioned on the fifth metal wiring layer 02, the second plate c2 may be positioned on the fourth metal wiring layer 03, and the source s and the drain d may be positioned on the third metal wiring layer 04.

The first signal lines 100 are arranged in various manners, and the first signal line 100 is, for example, a data signal line (Data line). In the present application, an example in which the first signal line 100 is the data signal line is given for illustration. In these optional embodiments, the first direction X is a column direction, and the second direction Y is a row direction.

In other embodiments, the first signal line 100 may also be a scan signal line (Scan line) or a light-emitting control signal line (Emit line) or a reference voltage line (Vref line).

Optionally, in the second region TA, the first connection lines 200 are electrically connected to the first pixel circuit (not shown). Orthographic projections of the first connection lines 200 on the substrate 01 may overlap with an orthographic projection of the first pixel circuit on the substrate 01.

In an example, in the second region TA, the first connection lines 200 are not electrically connected to pixel circuits. Orthographic projections of the first connection lines 200 on the substrate 01 may overlap with an orthographic projection of the transition pixel circuit on the substrate 01.

The first connection lines 200 and the first signal lines 100 may be arranged in a same layer or on different layers, or the first signal lines 100 and one part of the first connection lines 200 are arranged in a same layer, and the first signal lines 100 and the other part of the first connection lines 200 are arranged in different layers. Optionally, the first connection lines 200 and the first signal lines 100 are arranged in the same layer, so that a process for manufacturing the array substrate can be simplified. It should be noted that one of the first connection lines 200 is correspondingly connected to one of separated first signal lines 100, and other first signal lines 100 overlapping with the first connection lines 200 may be electrically connected by vias to prevent a short circuit between different first signal lines 100.

In some optional embodiments, the first connection segment 210 and the third connection segment 230 are arranged in a same layer. The first connection segment 210 and the third connection segment 230 extend along a same direction. The first connection segment 210 and the third connection segment 230 are arranged in the same layer, so that a process for manufacturing the array substrate can be simplified.

Figure 4:
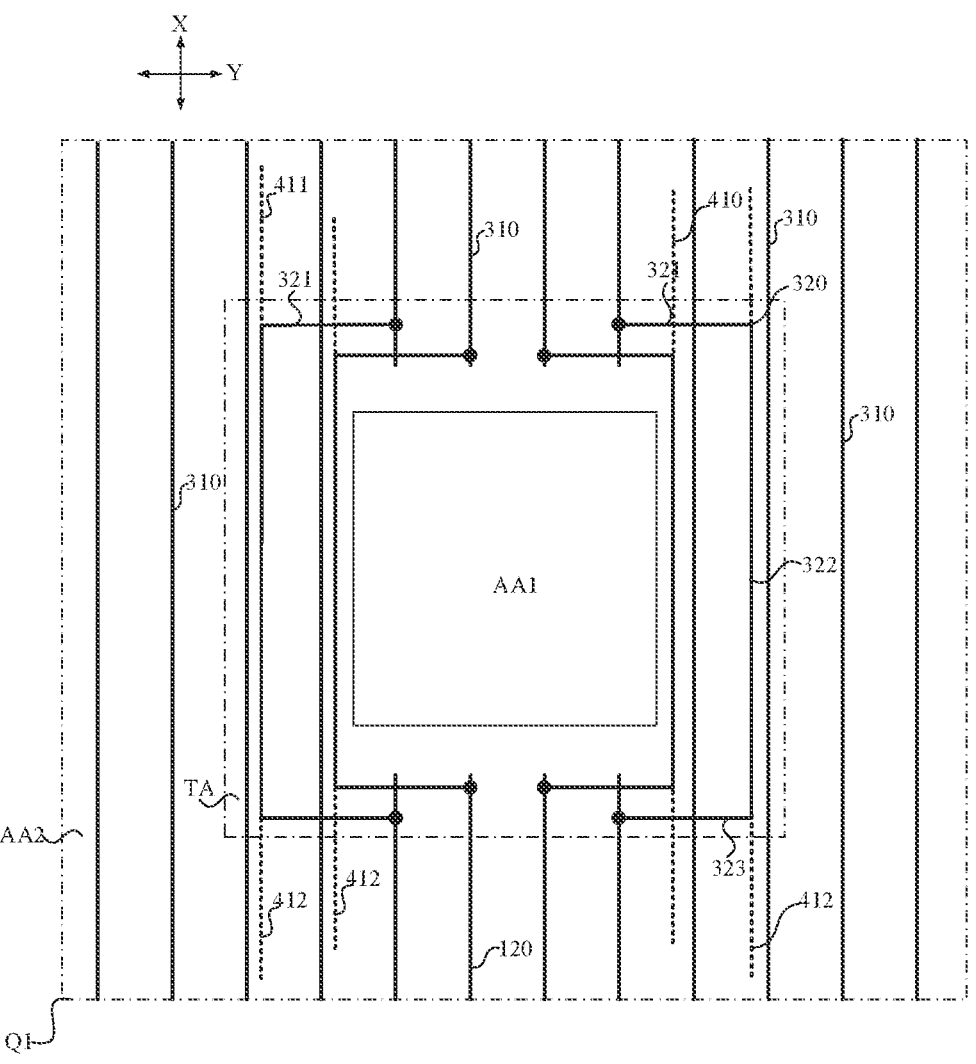
FIG. 4 is an enlarged schematic view of a first metal wiring layer of the region Q1 in FIG. 1 in an embodiment.
Figure 5:
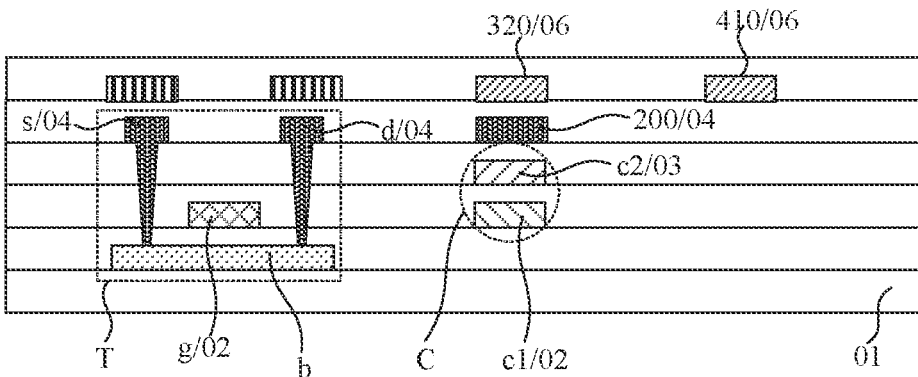
FIG. 5 is a partial cross-sectional view of an array substrate in another embodiment.

With reference to FIG. 3 to FIG. 5, in which FIG. 4 is an enlarged schematic view of a first metal wiring layer of the region Q1 in FIG. 1 in an embodiment. FIG. 5 is a partial cross-sectional view of an array substrate in another embodiment.

As shown in FIG. 3 to FIG. 5, according to the array substrate provided by the embodiments of the present application, the first metal wiring layer 06 includes a plurality of first compensation lines 410 extending along the first direction X, and an orthographic projection of the first compensation line 410 on the substrate 01 is positioned on an extending line of an orthographic projection of the second connection segment 220 on the substrate 01.

In these optional embodiments, the orthographic projection of the first compensation line 410 on the substrate 01 is positioned on the extending line of the orthographic projection of the second connection segment 220 on the substrate 01, so that a difference in a density of the metal wirings caused by arranging the second connection segments 220 can be reduced, therefore uniformity of a density of the metal wirings of the array substrate along the first direction X can be improved, thereby mitigating a problem of uneven display.

Optionally, as shown in FIG. 3 to FIG. 5, the first metal wiring layer 06 further includes first blocking lines 310, and an orthographic projection of the first signal line 100 on the substrate 01 is positioned within an orthographic projection of the first blocking line 310 on the substrate 01. That is, in the top view, a position where the first blocking lines 310 are distributed is same as a position where the first signal lines 100 are distributed, so that the first blocking lines 310 can block, along a direction perpendicular to a plane where the substrate 01 is positioned, the first signal lines 100, and a display difference caused by arranging the first signal lines 100 and other signal lines on different layers can be reduced, thereby improving the display effect.

Optionally, as shown in FIG. 3 to FIG. 5, the first metal wiring layer 06 further includes second blocking lines 320, and an orthographic projection of the first signal line 200 on the substrate 01 is positioned within an orthographic projection of the second blocking line 320 on the substrate 01. That is, in the top view, a position where the second blocking lines 320 are distributed is same as a position where the first signal lines 200 are distributed, so that the second blocking lines 320 can block, along the direction perpendicular to the plane where the substrate 01 is positioned, the first connection lines 200, and a display difference caused by arranging the first connection lines 200 and other signal lines on the different layers can be reduced, thereby improving the display effect.

In the embodiments of the present application, "the orthographic projection of the first compensation line 410 on the substrate 01 is positioned on the extending line of the orthographic projection of the second connection segment 220 on the substrate 01" means that a position where the first compensation line 410 is arranged and a position where the second connection segment 220 is arranged are in a one-to-one correspondence, and an orthographic projection of a single first compensation line 410 on the substrate 01 is positioned on an extending line of an orthographic projection of a single second connection segment 220 on the substrate 01. "On the extending line" does not need to be on an extending line in a strict geometric sense, due to errors in the manufacturing process, as long as the orthographic projection of the first compensation line 410 on the substrate 01 is positioned, within an error range, on the extending line of the orthographic projection of the second connection segment 220 on the substrate 01.

Figure 6:
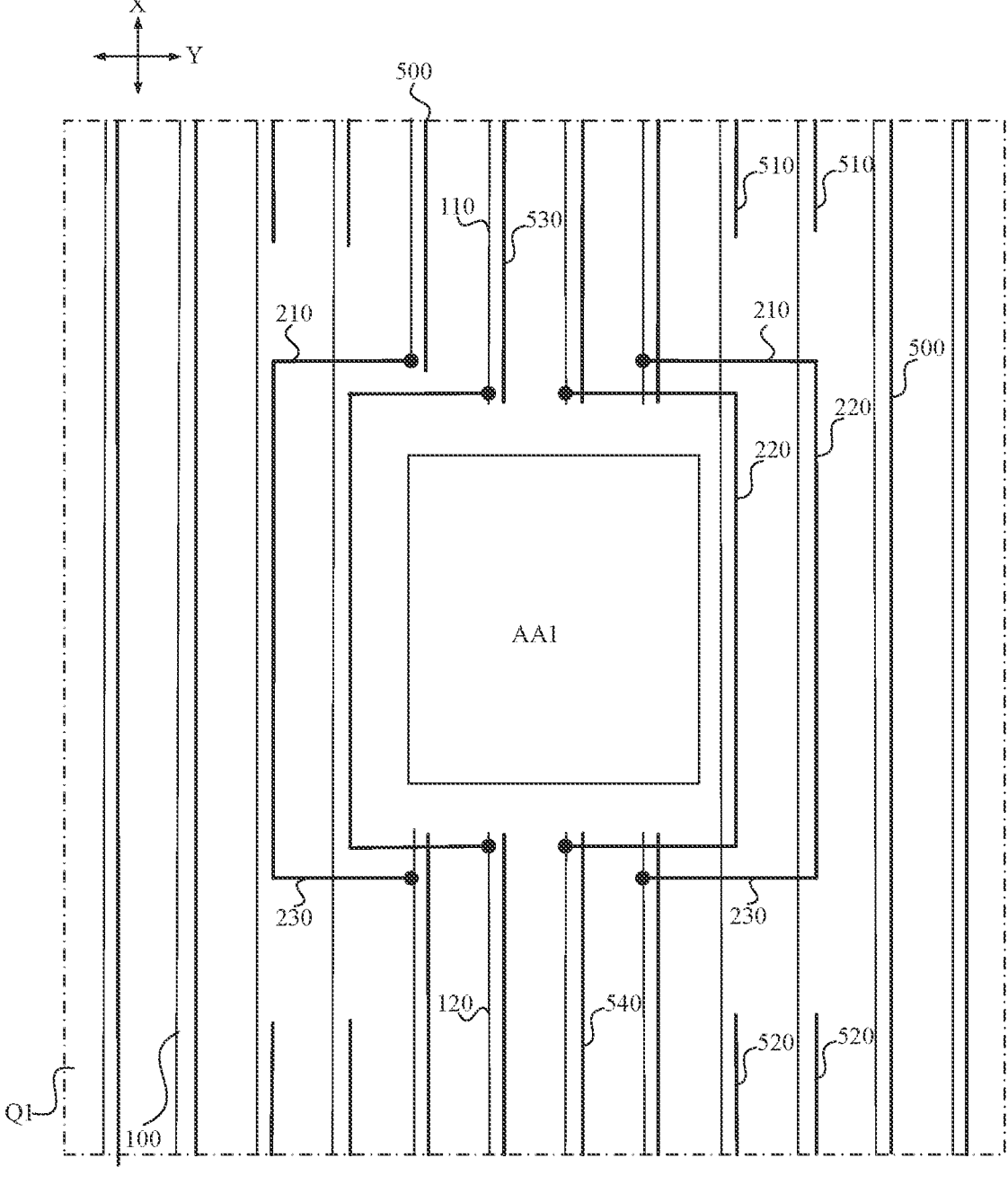
FIG. 6 is a schematic enlarged view of the region Q1 in FIG. 1 in another embodiment.
Figure 7:
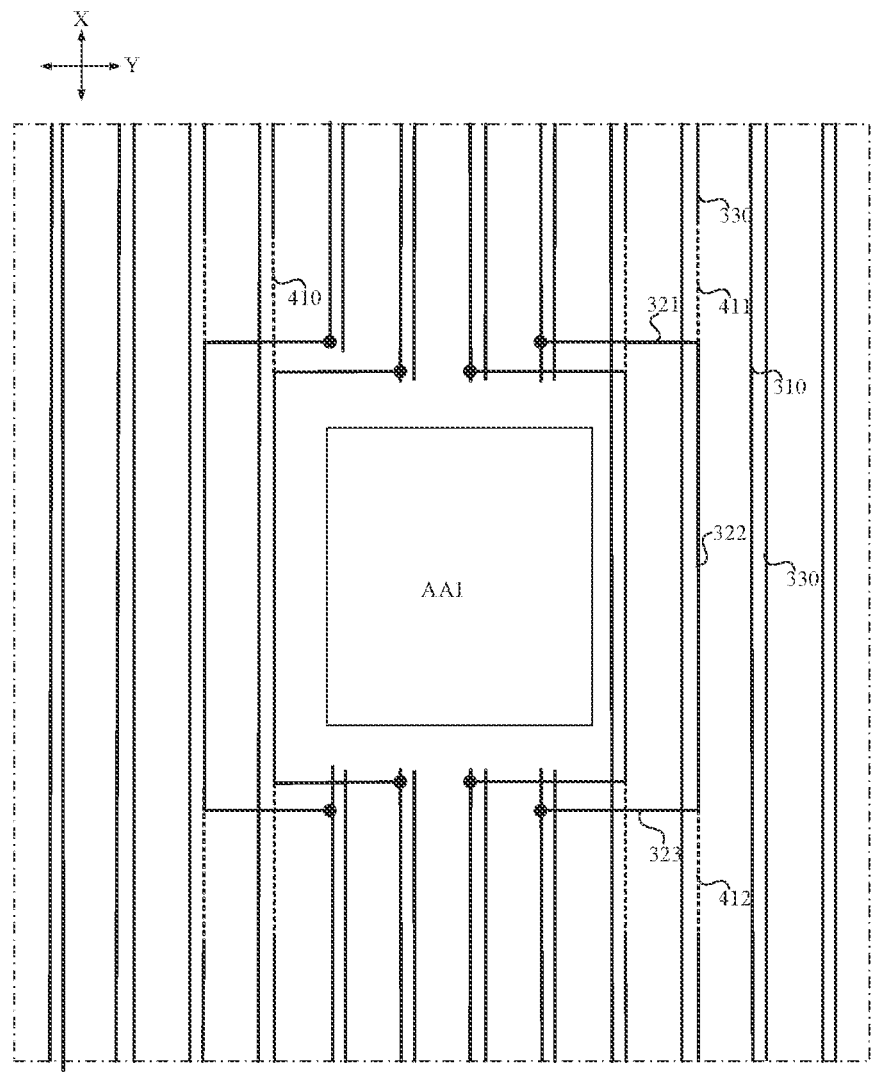
FIG. 7 is a schematic enlarged view of a first metal wiring layer of the region Q1 in FIG. 1 in another embodiment.

With reference to FIG. 6 and FIG. 7, in which FIG. 6 is a schematic enlarged view of the region Q1 in FIG. 1 in another embodiment of the present application. FIG. 7 is a schematic structural view of a wiring of the first metal wiring layer in another embodiment of the present application.

As shown in FIG. 6 and FIG. 7, the other metal wiring layers in the metal wiring layers 011 further include a plurality of second signal lines 500, and at least one of the second signal lines 500 includes a third segment 510 and a fourth segment 520 separated by the second connection segment 220 and extending along the first direction X. That is, orthographic projections of the third segment 510 and the fourth segment 520 on the substrate 01 are positioned on the extending line of the orthographic projection of the second connection segment 220 on the substrate 01; and the orthographic projection of the first compensation line 410 on the substrate 01 is positioned between the orthographic projection of the second connection segment 220 on the substrate 01 and an orthographic projection of the third segment 510 and/or the fourth segment 520 on the substrate 01.

In these optional embodiments, the orthographic projections of the third segment 510 and the fourth segment 520 on the substrate 01 are positioned on the extending line of the orthographic projection of the second connection segment 220 on the substrate 01 without providing provide more and longer first compensation lines 410, so that complexity of the metal wirings can be reduced, and meanwhile the uniformity of the density of the metal wirings of the array substrate along the first direction X can be improved.

Optionally, as shown in FIG. 7, the first metal wiring layer 06 further includes a plurality of third blocking lines 330, and an orthographic projection of the second signal line 500 on the substrate 01 is positioned within an orthographic projection of the third blocking line 330 on the substrate 01. That is, a position where the third blocking lines 330 are distributed is same as a position where the second signal lines 500 are distributed, so that the third blocking lines 330 can block, along the direction perpendicular to the plane where the substrate 01 is positioned, the second signal lines 500, and a display difference caused by arranging the second signal lines 500 and other signal lines on different layers can be reduced. Optionally, the orthographic projection of the third blocking line 330 on the substrate 01 overlaps with the orthographic projection of the second signal line 500 on the substrate 01.

Since the position where the third blocking lines 330 are distributed is the same as the position where the second signal lines 500 are distributed, as shown in FIG. 7, the orthographic projection of the first compensation line 410 on the substrate 01 is positioned between the orthographic projection of the third blocking line 330 on the substrate 01 and the orthographic projection of the second connection segment 220 on the substrate 01, which is configured to compensate for a gap between the second signal line 500 and the second connection segment 220, so that the density of the metal lines can be compensated, and the density of the metal lines tends to be uniform, thereby improving the display effect.

Optionally, as shown in FIG. 6, the second signal line 500 includes a first type line, a second type line and a third type line, the first type line includes the third segment 510 and the fourth segment 520, the second type line is positioned in the third region AA2 and is formed integrally and extends along the first direction X, and the third type line includes a seventh segment 530 and an eighth segment 540 separated by the first region AA1 and extending along the first direction X.

In some optional embodiments, under a condition that the array substrate includes the second signal lines 500, the first compensation lines 410 are arranged in various manners. For example, as shown in FIG. 7, the first compensation line 410 includes a first compensation segment 411, and an orthographic projection of the first compensation segment 411 on the substrate 01 is positioned between an orthographic projection of the third segment 510 on the substrate 01 and the orthographic projection of the second connection segment 220 on the substrate 01, so that the first compensation line 410 can compensate for a display difference caused by a gap existing between the third segment 510 and the second connection segment 220.

Alternatively, as shown in FIG. 7, the first compensation line 410 includes a second compensation segment 412, and an orthographic projection of the second compensation segment 412 on the substrate 01 is positioned between an orthographic projection of the fourth segment 520 on the substrate 01 and the orthographic projection of the second connection segment 220 on the substrate 01. The second compensation segment 412 can reduce a display difference caused by a gap existing between the fourth segment 520 and the second connection segment 220.

Optionally, the first compensation line 410 may include the first compensation segment 411 and the second compensation segment 412 described above at the same time, so that the effect can be further improved and the display difference can be reduced.

Optionally, as shown in FIG. 7, the second blocking line 320 includes a second blocking segment 322, and the orthographic projection of the second connection segment 220 on the substrate 01 is positioned within an orthographic projection of the second blocking segment 322 on the substrate 01, and optionally, the orthographic projection of the second connection segments 220 on the substrate 01 overlaps with the orthographic projection of the second blocking segment 322 on the substrate 01. The first compensation line 410 and a second blocking segment 322 on an extending line of the first compensation line 410 are connected to each other, so that a display difference caused by a gap between the first compensation line 410 and the second blocking segment 322 can be reduced.

The third blocking line 330 and the first compensation line 410 are arranged in a same layer. Optionally, as shown in FIG. 7, the first compensation line 410 and a third blocking line 330 positioned on an extending line of the first compensation line 410 are connected to each other, that is, an end portion of the third blocking line 330 and an end portion of the first compensation line 410 positioned on a same straight line as the third blocking line 330 are connected to each other, so that a display difference caused by a gap existing between the third blocking line 330 and the first compensation line 410 can be reduced. For example, the first compensation segment 411 and the third blocking line 330 positioned on an extending line of the first compensation segment 411 are connected to each other, or the second compensation segment 412 and the third blocking line 330 positioned on an extending line of the second compensation segment 412 are connected to each other, so as to avoid a display difference caused by spacing apart the first compensation line 410 and the third blocking line 330.

Optionally, as shown in FIG. 7, a position where the first blocking line 310 is arranged corresponds to a position where the first signal line 100 is arranged, a position where the second blocking line 320 is arranged corresponds to a position where the first connection line 200 is arranged, and the first signal line 100 and the first connection line 200 are connected to each other. In order to further block a position where the first signal line 100 and the first connection line 200 are connected to each other, the first blocking line 310 intersects with the second blocking line 320, and the first blocking line 310 and the second blocking line 320 are connected to each other at a position where the first blocking line 310 intersects with the second blocking line 320.

The second signal line 500 is, for example, a power signal line for transmitting a power signal. Or the second signal line 500 may also be a voltage reference line.

Optionally, a pixel circuit includes a thin film transistor, the thin film transistor includes a source electrode including a source and a drain electrode including a drain, and one of the source and the drain is connected to the power signal line.

Under a condition that the second signal line 500 is the power signal line, the second signal line 500 and the source/drain electrodes may be arranged in a same layer, so that the second signal line 500 can transmit the power signal to the source/drain electrodes. Or the second signal line 500 and the source/drain electrodes are arranged in different layers, an insulating layer is arranged between the second signal line 500 and the source/drain electrodes, and a via is arranged in the insulating layer, so that the second signal line 500 may be electrically connected to the source/drain electrodes through the via.

Or under a condition that the second signal line 500 is the power signal line, the second signal line 500 includes a power output signal line and a power input signal line which are arranged in different layers, and the power output signal line and the source/drain electrodes are arranged in a same layer.

The inventors have also found that, under a condition that the third blocking line 330 is not connected to other signal line, a parasitic capacitance occurs between the third blocking line 330 and the second signal line 500, so that stability of the signal is affected, thereby affecting display stability.

In some other optional embodiments, under a condition that the second signal line 500 is the power signal line or the Vref line, the third blocking line 330 and the second signal line 500 are connected to each other, so that not only a problem of the parasitic capacitance can be mitigated to improve stability of the signal, but also the second signal line 500 and the third blocking line 330 are connected in parallel, so that resistance of the second signal line 500 may be further reduced, therefore a voltage drop on the second signal line 500 may be further reduced.

Figure 8:
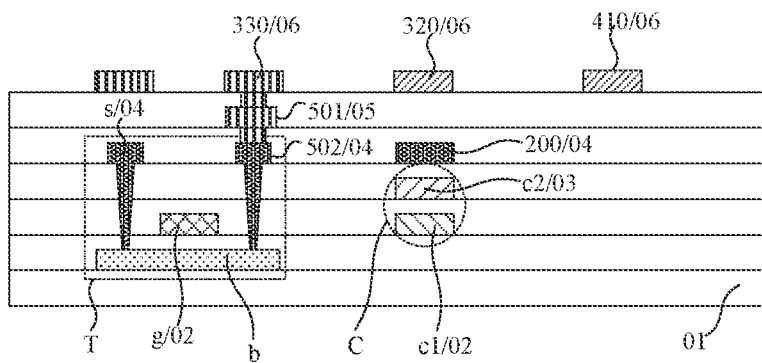
FIG. 8 is a partial cross-sectional view of an array substrate in yet another embodiment.

With reference to FIG. 7 and FIG. 8, in which FIG. 8 is a partial cross-sectional view of an array substrate in yet another embodiment.

Optionally, under a condition that the second signal line 500 is the power signal line, as shown in FIG. 7 and FIG. 8, the second signal line 500 includes a first sub-signal line 501 and a second sub-signal line 502 which are electrically connected to each other and positioned on different layers. The first sub-signal line 501 and the second sub-signal line 502 may be connected to each other through the via. At least a part of the third blocking lines 330 are electrically connected to one of the first sub-signal line 501 and the second sub-signal line 502. In an example, other metal wiring layers in the metal wiring layers 011 further include a second metal wiring layer 05, and the first sub-signal line 501 may be arranged in the second metal wiring layer 05.

In an example, an orthographic projection of the first sub-signal line 501 on a plane where the array substrate is positioned may overlap with an orthographic projection of the second sub-signal line 502 on a plane where the array substrate is positioned. The orthographic projection of the first sub-signal line 501 on the plane where the array substrate is positioned may completely coincide with the orthographic projection of the second sub-signal line 502 on the plane where the array substrate is positioned.

In the embodiments of the present application, the second signal line 500 is arranged as two sub-signal lines positioned on different layers, so that the two sub-signal lines are connected in parallel, and the resistance of the second signal line 500 may be further reduced, therefore the voltage drop on the second signal line 500 may be further reduced.

In some optional embodiments, with further reference to FIG. 6, the first direction X is the column direction, the second direction Y is the row direction, the first signal line 100 is a data line, the second signal line 500 extends along the first direction X, and the second signal line 500 is the power signal line.

As shown in FIG. 6 and FIG. 8, the first signal line 100, the second sub-signal line 502 and the first connection line 200 are positioned on a same layer. Optionally, under a condition that the first signal line 100 is the data line, the first signal line 100 and the source s are connected to each other, and along a direction of the cross-sectional view in FIG. 8, a position where the first signal line 100 is positioned is same as a position where the source s is positioned. As such, the first signal line 100, the second sub-signal line 502, and the first connection line 200 may be formed in same process steps at the same time, so that the process steps can be reduced.

In some other optional embodiments, the plurality of second signal lines 500 are arranged in a same layer, and the second signal line 500 and the first signal line 100 may be arranged in a same layer or different layers. The second signal line 500 and the first signal line 100 are arranged in the same layer, so that the second signal line 500 and the first signal line 100 may be prepared in same process steps, so as to reduce preparing difficulty of the array substrate.

Optionally, the second signal line 500, the first signal line 100 and the first connection line 200 are arranged in a same layer, and the first connection line 200 and the second signal line 500 are insulated from each other, so that efficiency of manufacturing the array substrate can be further improved.

The inventors of the present application have found that, as shown in FIG. 3, since the first connection line 200 includes the first connection segment 210 and the third connection segment 230 extending along the second direction Y, a density of metal wirings extending along the second direction Yin the second region TA occupied by first connection segments 210 and third connection segments 230 is greater than a density of metal wirings extending along the second direction Y in the third region AA2, and since the densities of the metal wirings extending along the second direction Y in the second region TA and the third region AA2 are different, a problem such as the uneven display (such as mura) may occur when the array substrate drives a light-emitting element to display.

Figure 9:
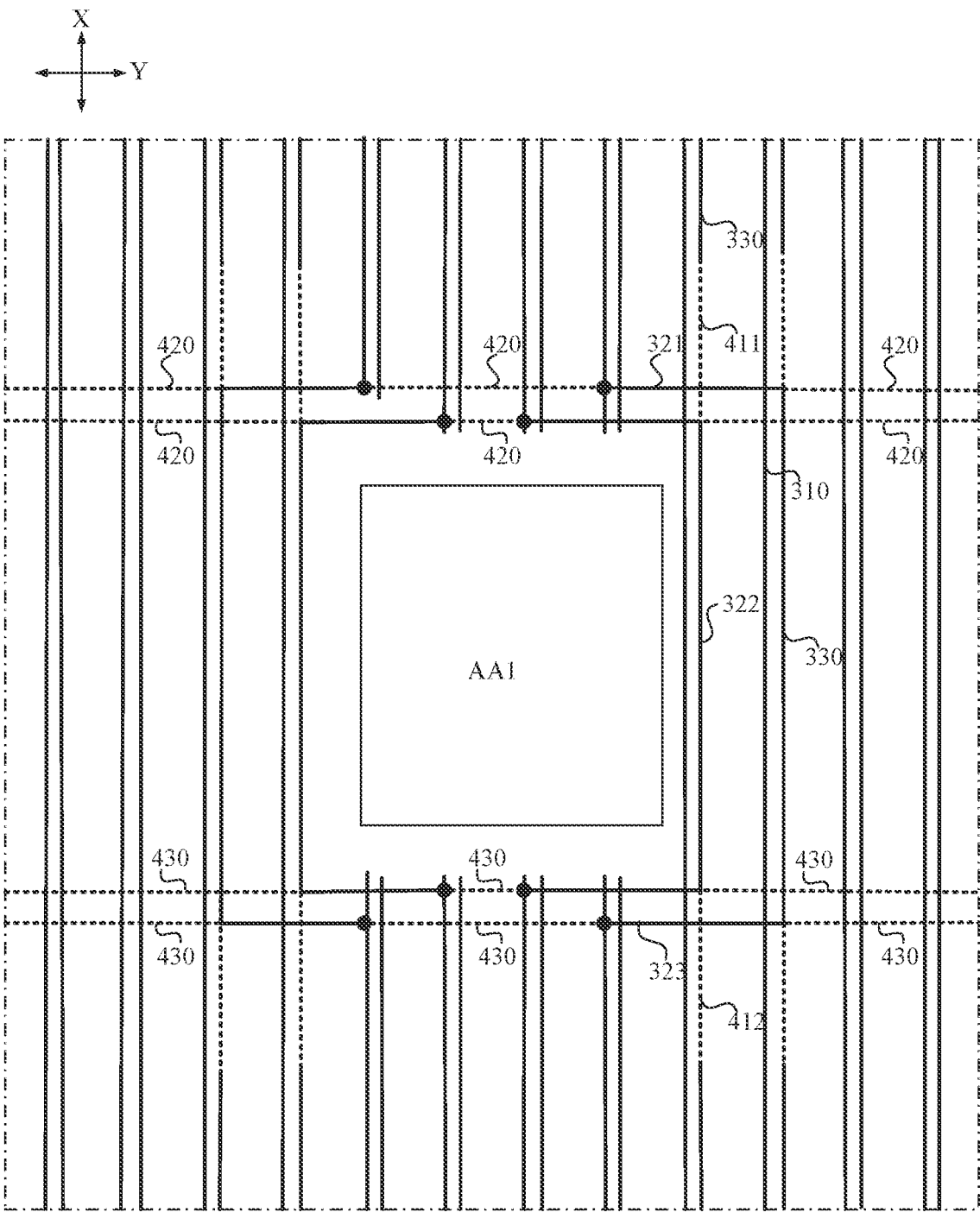
FIG. 9 is a schematic enlarged view of a first metal wiring layer of the region Q1 in FIG. 1 in yet another embodiment.

With reference to FIG. 3 and FIG. 9, in which FIG. 9 is a schematic structural view of a first metal wiring layer according to yet another embodiment of the present application.

As shown in FIG. 3 and FIG. 9, the first metal wiring layer 06 includes a plurality of second compensation lines 420, and an orthographic projection of the second compensation line 420 on the substrate 01 is positioned on an extending line of an orthographic projection of the first connection segment 210 on the substrate 01.

In these optional embodiments, the second compensation lines 420 are arranged to reduce a difference in the densities of the metal wirings extending along the second direction Y in the second region TA and the third region AA2, and the second compensation lines 420 and the first connection segments 210 extend along the second direction Y, so that the densities of the metal wirings extending along the second direction Y in the second region TA and the third region AA2 tends to be uniform, thereby mitigating the problem of uneven display (such as mura).

Positions where the second compensation lines 420 are positioned are various. For example, the first connection line 200 includes two first connection segments 210 spaced apart along the second direction Y. The second compensation line 420 may be correspondingly arranged between the two first connection segments 210, and/or the second compensation line 420 may be correspondingly arranged on a side of one of the first connection segment 210 away from the other of the first connection segments 210. That is, the orthographic projection of the second compensation line 420 on the substrate 01 is positioned on a side of an orthographic projection of one of the first connection segments 210 on the substrate 01 away from an orthographic projection of the other of the first connection segments 210 on the substrate 01, and/or the orthographic projection of the second compensation line 420 on the substrate 01 is positioned between orthographic projections of the two first connection segments 210 on the substrate 01, so that the display difference can be further reduced.

Optionally, the second blocking line 320 further includes a first blocking segment 321, and the orthographic projection of the first connection segment 210 on the substrate 01 is positioned within an orthographic projection of the first blocking segment 321 on the substrate 01, and optionally, the orthographic projection of the first connection segment 210 on the substrate 01 overlaps with the orthographic projection of the first blocking segment 321 on the substrate 01. The second compensation line 420 is positioned on an extending line of the first blocking segment 321, and the second compensation line 420 and the first blocking segment 321 positioned on the second compensation line 420 may be connected to each other, that is, an end portion of the second compensation line 420 and an end portion of the first blocking segment 321 positioned on a same straight line as the second compensation line 420 are connected to each other, so that a display difference caused by a gap existing between the second compensation line 420 and the first blocking segment 321 can be reduced.

With further reference to FIG. 9, in some other optional embodiments, the first metal wiring layer 06 includes a plurality of third compensation lines 430, and an orthographic projection of the third compensation line 430 on the substrate 01 is positioned on an extending line of an orthographic projection of the third connection segment 230 on the substrate 01.

In these optional embodiments, the third compensation lines 430 are arranged to reduce a display difference caused by arranging the third connection segments 230, so that uniformity of a density of metal wirings of the array substrate along the second direction Y can be improved, and the display difference can be reduced.

Positions where the third compensation lines 430 are arranged are various. Optionally, the first connection line 200 includes two of the third connection segments 230 spaced apart along the second direction Y, and the third compensation line 430 may be correspondingly positioned between the two third connection segments 230, or the third compensation line 430 may be correspondingly positioned on a side of one of the third connection segments 230 away from the other of the third connection segments 230. That is, the two third connection segments 230 are spaced apart along the second direction, the orthographic projection of the third compensation line 430 on the substrate 01 is positioned on a side of an orthographic projection of one of the third connection segments 230 on the substrate 01 away from an orthographic projection of the other of the third connection segments 230 on the substrate 01, and/or the orthographic projection of the third compensation line 430 on the substrate 01 is positioned between orthographic projections of the two third connection segments 230 on the substrate 01, so that the display difference can be further reduced.

Optionally, the second blocking line 320 further includes a third blocking segment 323, and the orthographic projection of the third connection segment 230 on the substrate 01 is positioned within an orthographic projection of the third blocking segment 323 on the substrate 01, and optionally, the orthographic projection of the third connection segment 230 on the substrate 01 overlaps with the orthographic projection of the third blocking segment 323 on the substrate 01 overlapping. The third compensation line 430 is positioned on an extending line of the third blocking segment 323. The third compensation line 430 and the third blocking segment 323 positioned on an extending line of the third compensation line 430 may be connected to each other. That is, an end portion of the third compensation line 430 and an end portion of the third blocking section 323 positioned on a same straight line as the third compensation line 430 are connected to each other, so that a display difference caused by a gap existing between the third compensation lines 430 and the third blocking segment 323 can be reduced.

Figure 10:
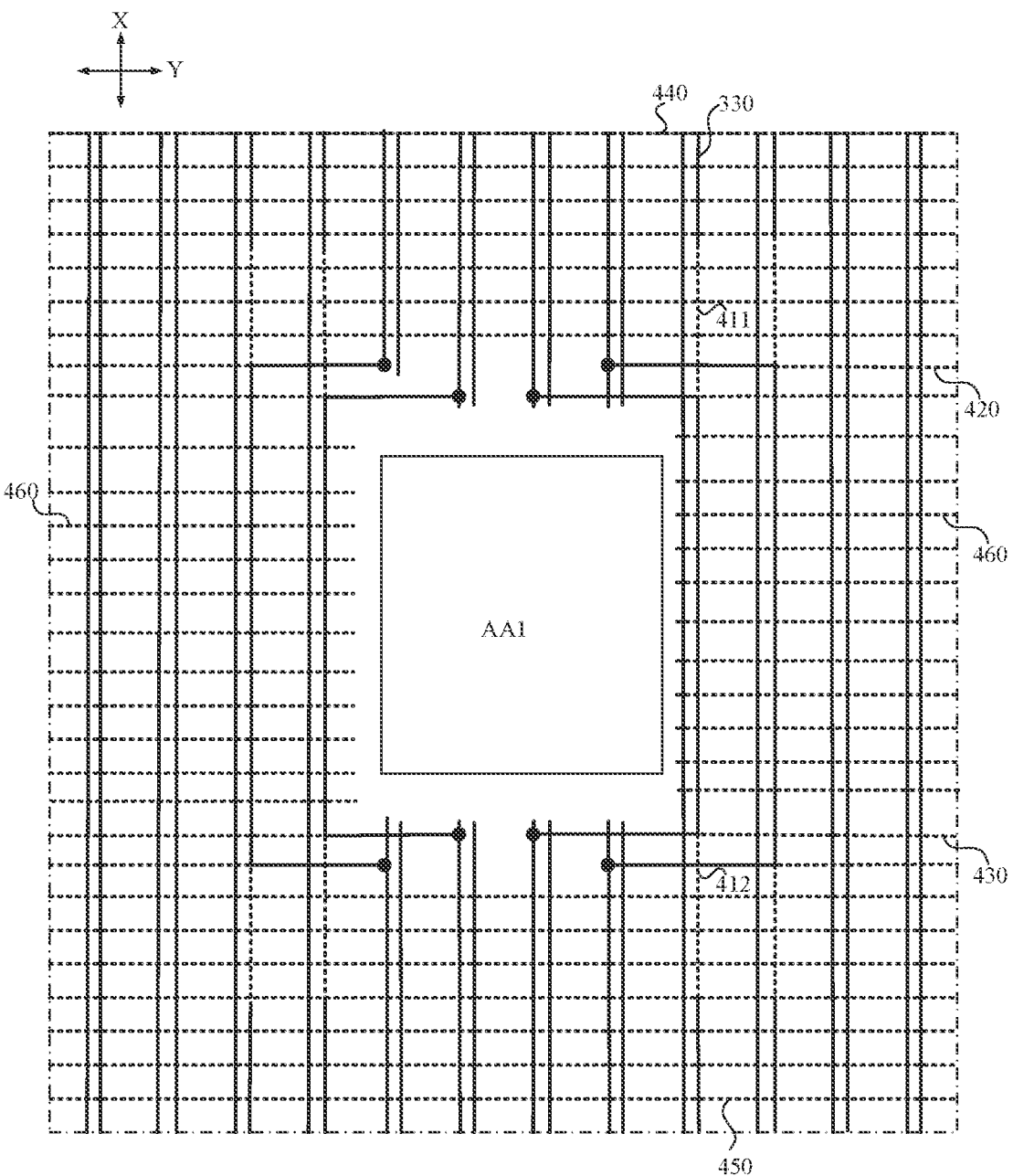
FIG. 10 is an enlarged schematic view of a first metal wiring layer of the region Q1 in FIG. 1 in yet another embodiment.

With reference to FIG. 3 and FIG. 10, in which FIG. 10 is a schematic structural view of a first metal wiring layer in yet another embodiment.

As shown in FIG. 3 and FIG. 10, in order to further improve the display effect of the display panel, the first metal wiring layer 06 further includes a plurality of fourth compensation lines 440 extending along the second direction Y, the fourth compensation lines 440 are positioned on a side of the first connection segment 210 away from the third connection segment 230, and a distance between two adjacent ones of the fourth compensation lines 440 is equal to a distance between two adjacent ones of the first connection segments 210.

In these optional embodiments, the fourth compensation lines 440 are positioned in the third region AA2, and, in the third region AA2, the fourth compensation lines 440 are arranged on a side of the first connection segment 210 away from the third connection segment 230, so that a display difference caused when first connection segments 210 arranged in the second region TA are more than first connection segments 210 arranged in the third region AA2 can be reduced.

Optionally, a width of the fourth compensation line 440 is equal to a width of the first connection segment 210, so that the display difference can be further reduced.

Optionally, a distance between the fourth compensation line 440 and the first connection segment 210 adjacent to the fourth compensation line 440 is equal to the distance between two adjacent ones of the first connection segments 210. Therefore, there is a same distance between the fourth compensation line 440 and the first connection segment 210, and the fourth compensation line 440 and the first connection segment 210 are arranged on a basis of a same density, so as to reduce the display difference.

Optionally, the distance between two adjacent ones of the fourth compensation lines 440, the distance between two adjacent ones of the first connection segments 210, and the distance between the fourth compensation line 440 and the first connection segment 210 adjacent to the fourth compensation line 440 are equal, and the width of the fourth compensation line 440 is equal to the width of the first connection segment 210.

With further reference to FIG. 10, in yet some other optional embodiments, the first metal wiring layer 06 further includes a plurality of fifth compensation lines 450 extending along the second direction Y, the fifth compensation lines 450 are positioned on a side of the third connection segment 230 away from the first connection segment 210, a distance between two adjacent ones of the fifth compensation lines 450 is equal to a distance between two adjacent ones of the third connection segments 230.

In these optional embodiments, the fifth compensation lines 450 are positioned in the third region AA2, and, in the third region AA2, the fifth compensation lines 450 are arranged on a side of the third connection segment 230 away from the first connection segment 210, so that a display difference caused when third connection segments 230 arranged in the second region TA are more than third connection segments 230 arranged in the third region AA2 can be reduced.

Optionally, a distance between the fifth compensation line 450 and the third connection segment 230 adjacent to the fifth compensation line 450 is equal to the distance between two adjacent ones of the third connection segments 230, so that there is a same distance between the fifth compensation line 450 and the third connection segment 230, and the fifth compensation line 450 and the third connection segment 230 are arranged on a basis of a same density, so as to reduce the display difference.

Optionally, the distance between two adjacent ones of the fourth compensation lines 440, the distance between two adjacent ones of the first connection segments 210, and the distance between the fourth compensation line 440 and the first connection segment 210 adjacent to the fourth compensation line 440, the distance between two adjacent ones of the fifth compensation lines 450, the distance between two adjacent ones of the third connection segments 230, and the distance between the fifth compensation line 450 and the third connection segment 210 adjacent to the fifth compensation line 450 are equal, and the width of the fourth compensation line 440, the width of the first connection segment 210, a width of the fifth compensation line 450, and a width of the third connection segment 230 are equal.

Optionally, the first metal wiring layer 06 further includes sixth compensation lines 460 extending along the second direction Y, the sixth compensation lines 460 are positioned on two sides of the first region AA1 along the second direction Y, and a plurality of sixth compensation lines 460 are positioned between the first connection segment 210 and the third connection segment 230 along the first direction X, and a distance between two adjacent ones of the sixth compensation lines 460 is equal to the distance between two adjacent ones of the third connection segments 230, so that the display difference can be further reduced.

Optionally, a distance between the sixth compensation line 460 and the third connection segment 230 adjacent to the sixth compensation line 460 is equal to the distance between two adjacent ones of the third connection segments 230, so that the display difference can be further reduced.

Optionally, the distance between two adjacent ones of the third connection segments 230 is equal to the distance between two adjacent ones of the first connection segments 210, so that the display difference can be further reduced.

Figure 11:
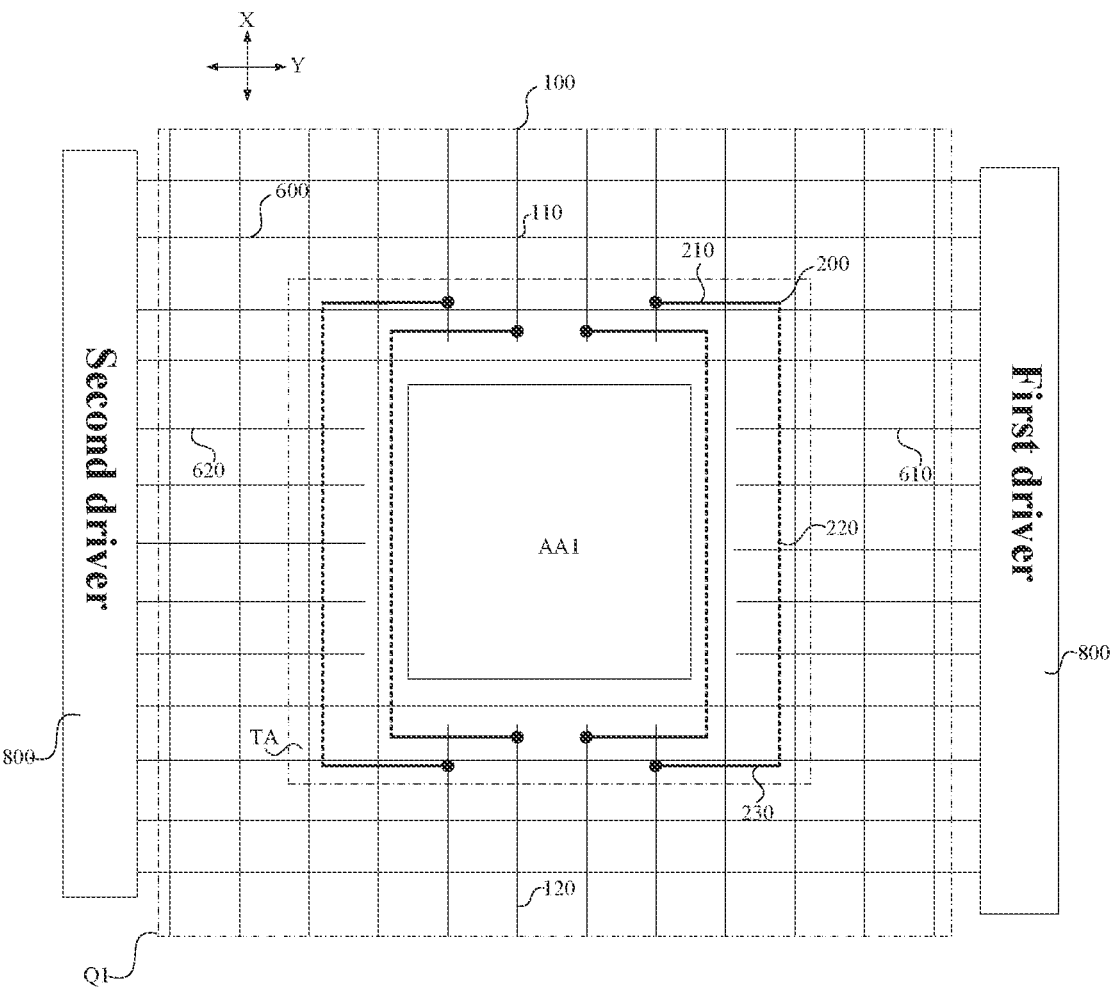
FIG. 11 is an enlarged schematic view of the region Q1 in FIG. 1 in yet another embodiment.

With reference to FIG. 11, which is an enlarged schematic view of the region Q1 in FIG. 1 in yet another embodiment.

In some optional embodiments, the other metal wiring layers in the metal wiring layers 011 further include third signal lines 600 extending along the second direction Y. The third signal line 600 is, for example, the scan line. At least one of the third signal lines 600 includes a fifth segment 610 and a sixth segment 620 separated by the first region AA1, another part of the third signal lines 600 are positioned on two sides of the first region AA1 along the first direction X, and another part of the third signal lines 600 are formed integrally along the second direction Y.

Figure 12:
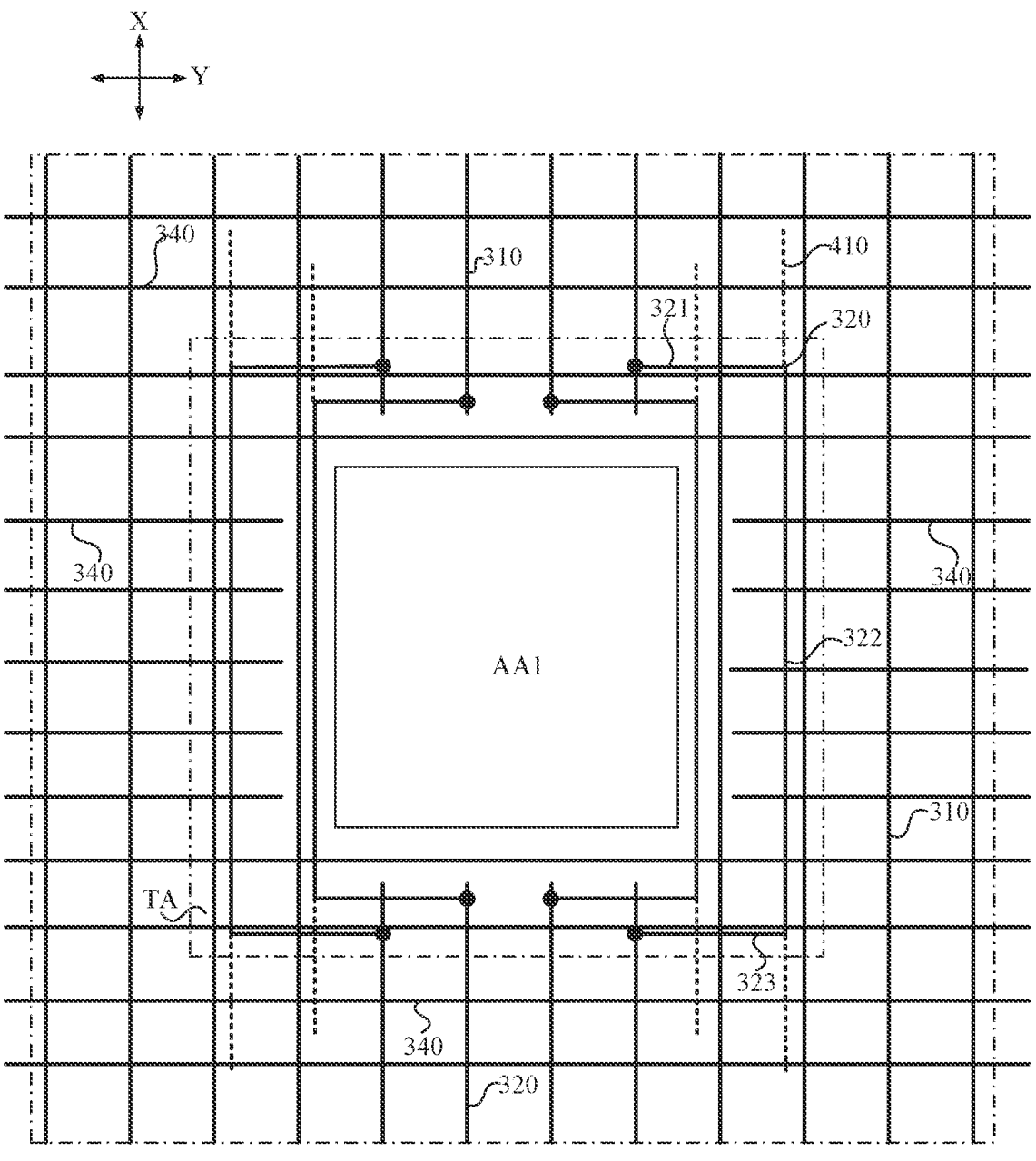
FIG. 12 is an enlarged schematic view of a first metal wiring layer of the region Q1 in FIG. 1 in yet another embodiment.

With reference to FIG. 11 and FIG. 12, in which FIG. 12 is an enlarged schematic view of a first metal wiring layer of the region Q1 in FIG. 1 in yet another embodiment.

Optionally, the first metal wiring layer 06 further includes fourth blocking lines 340, and an orthographic projection of the third signal line 600 on the substrate 01 is positioned within an orthographic projection of the fourth blocking line 340 on the substrate 01. For example, the orthographic projection of the third signal line 600 on the substrate 01 completely overlaps with the orthographic projection of the fourth blocking line 340 on the substrate 01, so that the uneven display can be further reduced.

The array substrate further includes one or more drivers 800 configured to transmit control signals to the third signal lines 600. The driver 800 is, for example, a scan driver configured to transmit the scan signal to the third signal line 600.

The drivers 800 are arranged in various manners. For example, as shown in FIG. 11, there are two drivers 800, the two drivers 800 are a first driver and a second driver respectively arranged on two sides of the first region AA1 along the second direction Y, the first driver is at least connected to the fifth segment 610, and the second driver is at least connected to the sixth segment 620.

Figure 13:
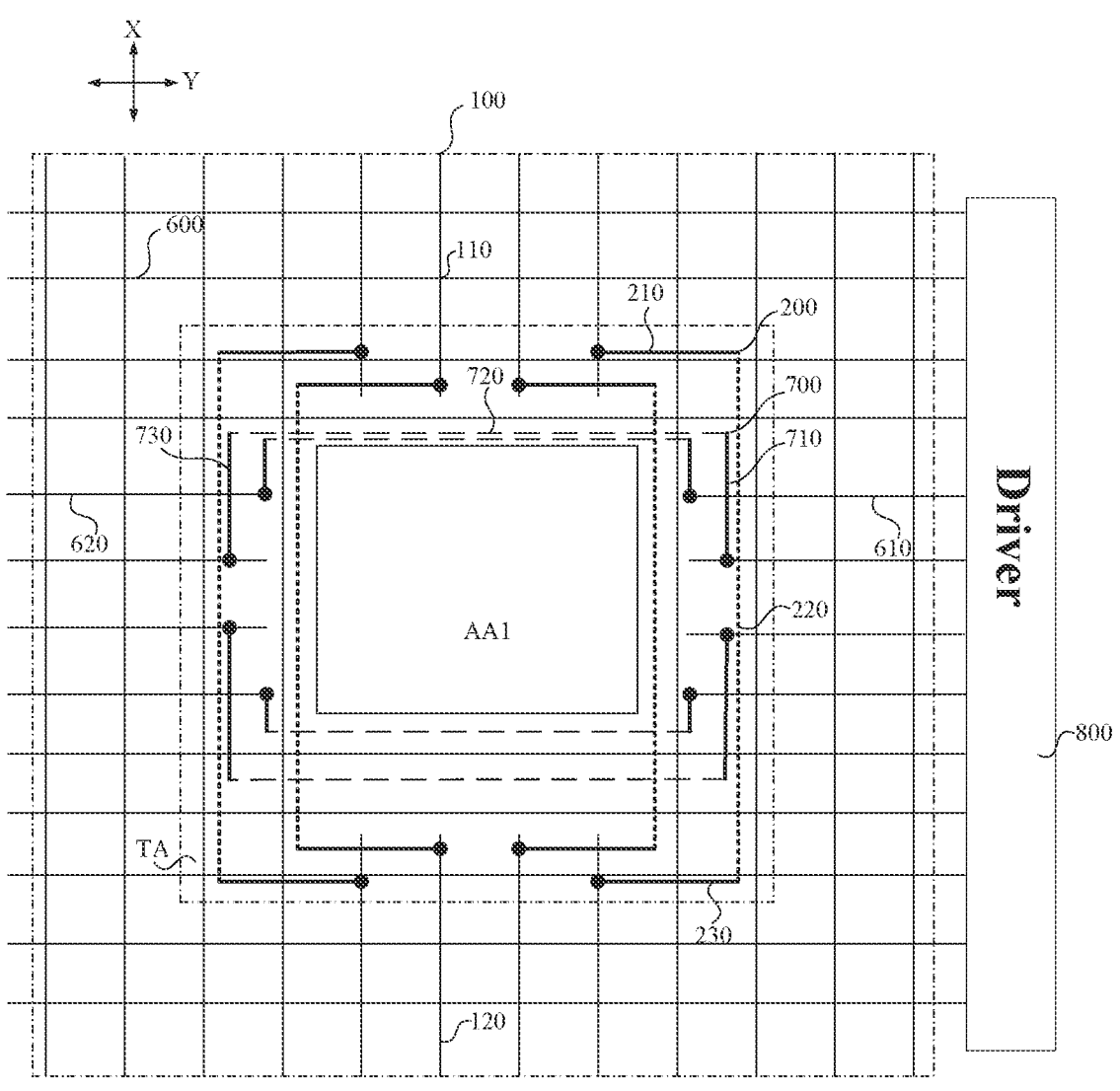
FIG. 13 is an enlarged schematic view of the region Q1 in FIG. 1 in yet another embodiment.

With reference to FIG. 13, which is an enlarged schematic view of the region Q1 in FIG. 1 in yet another embodiment.

In yet some other optional embodiments, there is one driver 800, the one driver 800 is arranged on one side of the second region TA along the second direction Y, the other metal wiring layers in the metal wiring layer 011 further include second connection lines 700 positioned in the second region TA, the second connection lines 700 are arranged around the first region AA1 and the second connection line 700 includes a fourth connection segment 710, a fifth connection segment 720 and a sixth connection segment 730 connected in sequence, the fourth connection segment 710 is electrically connected to the fifth segment 610, the fifth connection segment 720 is connected between the fourth connection segment 710 and the sixth connection segment 730, the sixth connection segment 730 is electrically connected to the sixth segment 620, the fifth connection segment 720 extends along the second direction Y, and the fourth connection segment 710 and the sixth connection segment 730 extend along the first direction X.

In these optional embodiments, the driver 800 is arranged on one side of the array substrate to transmit control information to the third signal line 600, and, in the array substrate, the fifth segment 610 and the sixth segment 620 positioned on different sides of the first region AA1 are connected to each other by the second connection line 700.

The inventors have found that, due to existence of the second connection lines 700, a density of metal wirings in the second region TA may be different from a density of metal wirings in the third region AA2, thereby causing the display difference.

Figure 14:
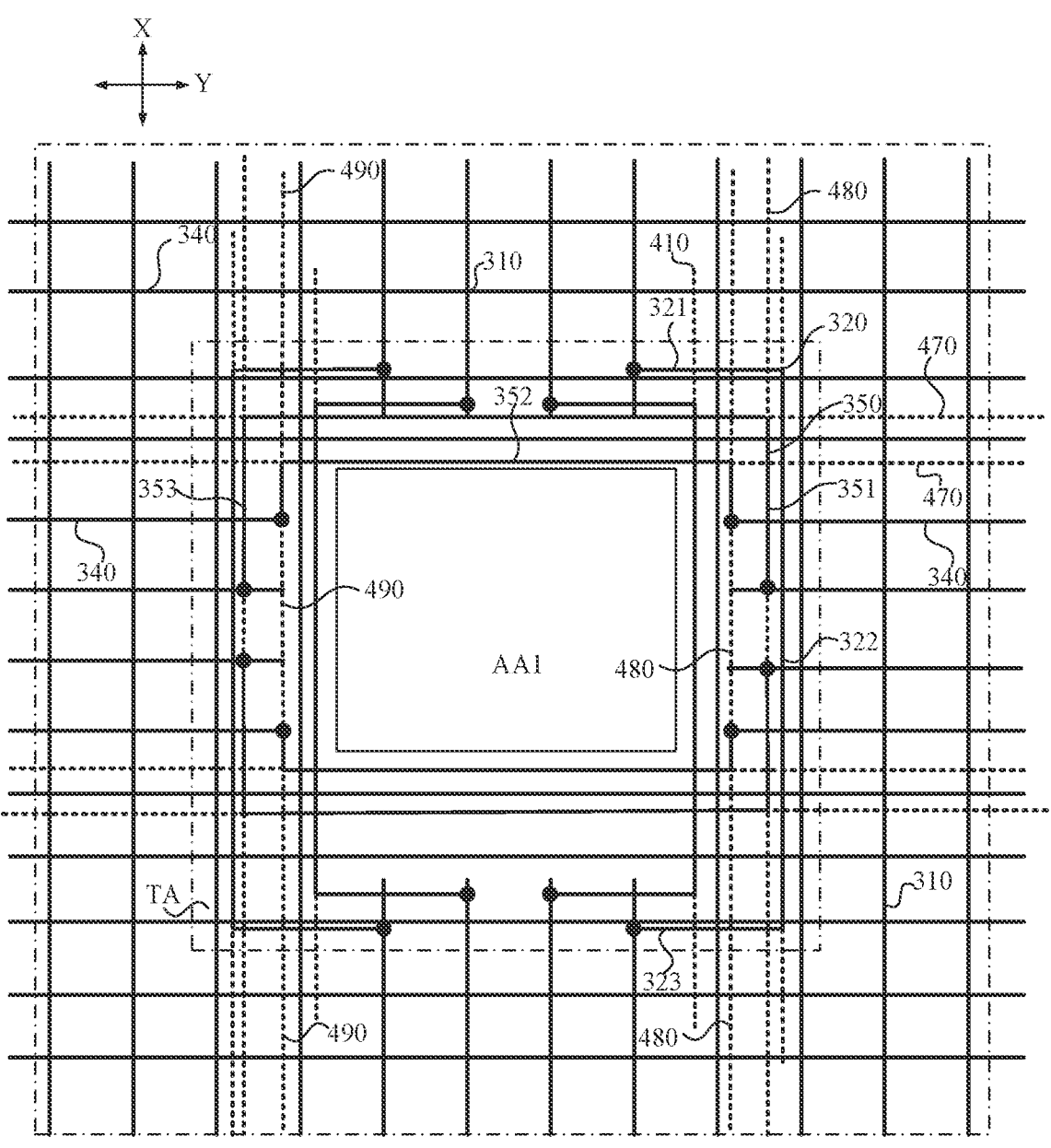
FIG. 14 is an enlarged schematic view of a first metal wiring layer of the region Q1 in FIG. 1 in yet another embodiment.

With reference to FIG. 13 and FIG. 14, in which FIG. 14 is an enlarged schematic view of a first metal wiring layer of the region Q1 in FIG. 1 in yet another embodiment.

In some optional embodiments, as shown in FIG. 14, the first metal wiring layer 06 further includes seventh compensation lines 470 extending along the second direction Y, and an orthographic projection of the seventh compensation line 470 on the substrate 01 is positioned on an extending line of an orthographic projection of the fifth connection segment 720 on the substrate 01. In these optional embodiments, the seventh compensation lines 470 may be arranged to reduce a difference in the density of the metal wirings caused by arranging the fifth connection segments 720, so that the display difference can be reduced.

Optionally, the first metal wiring layer 06 further includes fifth blocking lines 350, an orthographic projection of the second connection line 700 on the substrate 01 is positioned within an orthographic projection of the fifth blocking line 350 on the substrate 01. For example, the orthographic projection of the second connection line 700 on the substrate 01 completely overlaps with the orthographic projection of the fifth blocking line 350 on the substrate 01. The fifth blocking line 350 can block, along the direction perpendicular to the plane where the substrate 01 is positioned, the second connection line 700, so that a display difference caused by arranging the second connection lines 700 and the other metal wirings on different layers.

The third signal line 600 and the second connection line 700 are connected to each other. The fourth blocking line 340 is arranged correspondingly to the third signal line 600, and the fifth blocking line 350 is arranged correspondingly to the second connection line 700. In order to further block a position where the third signal line 600 and the second connection line 700 are connected to each other, the fourth blocking line 340 and the fifth blocking line 350 intersect with and are connected to each other, so that a position where the fourth blocking line 340 intersects with the fifth blocking line 350 can block the position where the third signal line 600 and the second connection line 700 are connected to each other.

The fifth blocking lines 350 are arranged in various manners. For example, the fifth blocking line 350 includes a fifth blocking segment 352, the orthographic projection of the fifth connection segment 720 on the substrate 01 is positioned within an orthographic projection of the fifth blocking segment 352 on the substrate 01, and the seventh compensation line 470 and the fifth blocking segment 352 positioned on an extending line of the seventh compensation line 470 are connected to each other, so that a display difference caused by spacing apart the seventh compensation line 470 and the fifth blocking segment 352 from each other can be reduced.

Optionally, with further reference to FIG. 14, the first metal wiring layer 06 further includes eighth compensation lines 480, and an orthographic projection of the eighth compensation line 480 on the substrate 01 is positioned on an extending line of an orthographic projection of the fourth connection segment 710 on the substrate 01. The eighth compensation line 480 may be configured to reduce a difference in densities of the metal wirings in a part of the second region TA and the third region AA2 caused by arranging fourth connection segments 710.

Positions where the eighth compensation lines 480 are arranged are various. The second connection line 700 includes two fourth connection segments 710 spaced apart along the first direction X, the eighth compensation line 480 may be arranged correspondingly between the two fourth connection segments 710, or the eighth compensation line 480 may be arranged correspondingly on a side of one of the fourth connection segments 710 away from the other of the fourth connection segments 710. That is, the two fourth connection segments 710 are spaced apart along the first direction X, the orthographic projection of the eighth compensation line 480 on the substrate 01 is positioned on a side of an orthographic projection of one of the fourth connection segments 710 on the substrate 01 away from an orthographic projection of the other of the of the fourth connection segment 710 on the substrate 01, and/or the orthographic projection of the eighth compensation line 480 on the substrate 01 is positioned between orthographic projections of the two fourth connection segments 710 on the substrate 01.

Optionally, the fifth blocking line 350 includes a fourth blocking segment 351, the orthographic projection of the fourth connection segment 710 on the substrate 01 is positioned within an orthographic projection of the fourth blocking segment 351 on the substrate 01, then, in the top view, a position where the fourth connection segments 710 are distributed is same as a position where fourth blocking segments 351 are distributed, and the fourth blocking segment 351 and the eighth compensation line 480 positioned on an extending line of the fourth blocking segment 351 may be connected to each other, so as to avoid a display difference caused by spacing apart the fourth blocking segment 351 and the eighth compensation line 480.

Optionally, the first metal wiring layer 06 further includes ninth compensation lines 490, an orthographic projection of the ninth compensation line 490 on the substrate 01 is positioned on an extending line of an orthographic projection of the sixth connection segment 730 on the substrate 01. The ninth compensation line 490 may be configured to reduce a difference in the densities of the metal wirings in a part of the second region TA and the third region AA2 caused by arranging sixth connection segments 730.

Positions where the ninth compensation lines 490 are arranged are various. The second connection line 700 includes two sixth connection segments 730 spaced apart along the first direction X, and the ninth compensation line 490 may be arranged correspondingly between the two sixth connection segments 730, or the ninth compensation line 490 may be arranged correspondingly on a side of one of the sixth connection segments 730 away from the other of the sixth connection segments 730. That is, the two sixth connection segments 730 are spaced apart along the first direction X, the orthographic projection of the ninth compensation line 490 on the substrate 01 is positioned on a side of an orthographic projection of one of the sixth connection segments 730 on the substrate 01 away from the orthographic projection of the other of the sixth connection segment 730 on the substrate 01, and/or the orthographic projection of the ninth compensation line 490 on the substrate 01 is positioned between orthographic projections of the two sixth connection segments 730 on the substrate 01.

Optionally, the fifth blocking line 350 includes a sixth blocking segment 353, the orthographic projection of the sixth connection segment 730 on the substrate 01 is positioned within an orthographic projection of the sixth blocking segment 353 on the substrate 01, then, in the top view, a position where the sixth connection segments 730 are distributed is same as a position where sixth blocking segments 353 are distributed, and the sixth blocking segment 353 and the ninth compensation line 490 positioned on an extending line of the sixth blocking segment 353 may be connected to each other, so as to avoid a display difference caused by spacing apart the sixth blocking segment 353 and the ninth compensation line 490.

Figure 15:
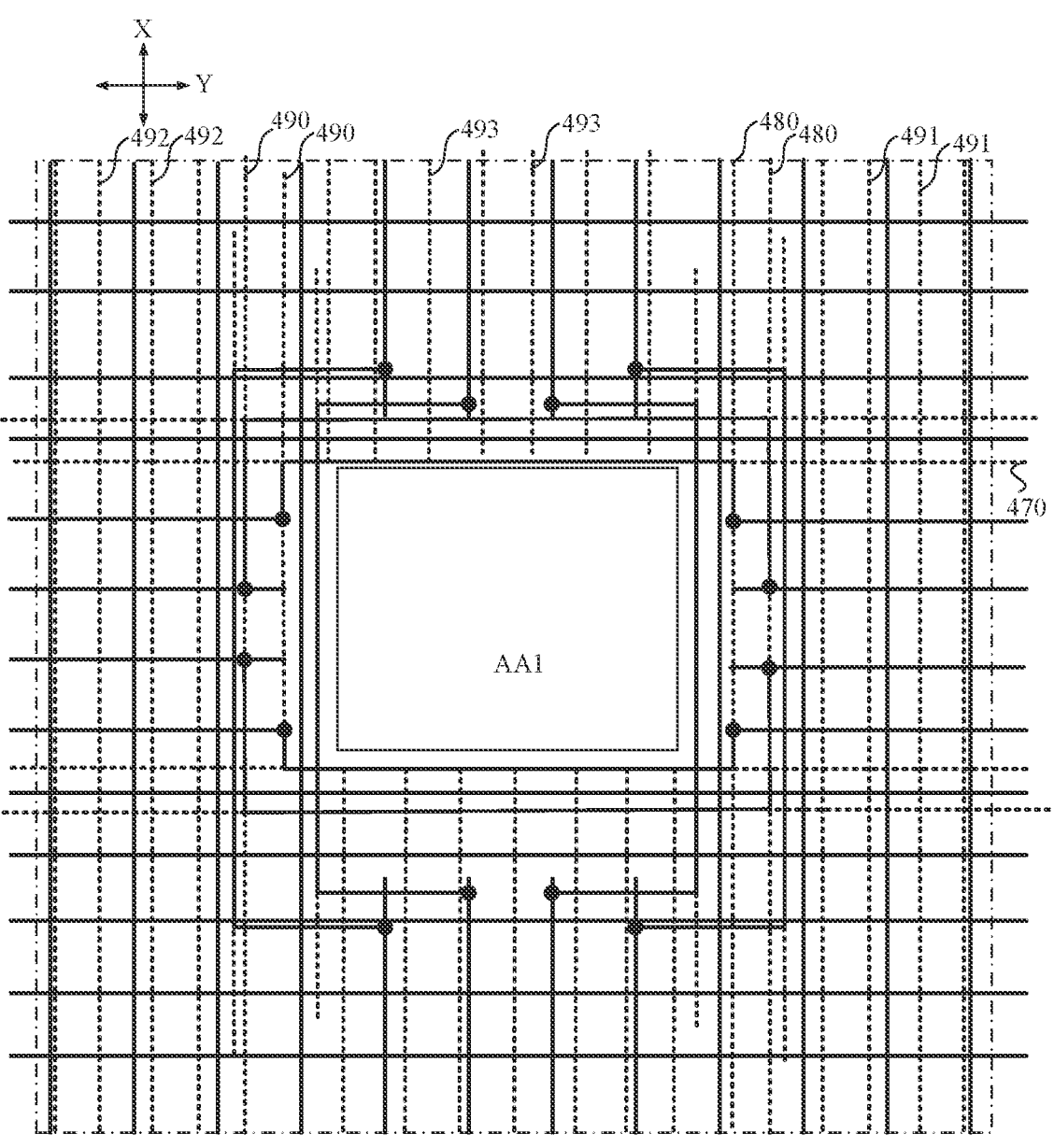
FIG. 15 is an enlarged schematic view of a first metal wiring layer of the region Q1 in FIG. 1 in yet another embodiment.

With reference to FIG. 13 and FIG. 15, in which FIG. 15 is an enlarged schematic view of the first metal wiring layer 06 of the region Q1 in FIG. 1 in yet another embodiment.

Optionally, the first metal wiring layer 06 further includes tenth compensation lines 491 extending along the first direction X, the tenth compensation line 491 is positioned on a side of the fourth connection segment 710 away from the sixth connection segment 730 along the second direction Y, and a distance between two adjacent ones of the tenth compensation lines 491 is equal to a distance between two adjacent ones of the fourth connection segments 710. Since, in the top view, the position where the fourth connection segments 710 are distributed is the same as the position where the fourth blocking segments 351 are distributed, and the fourth blocking segment 351 and the eighth compensation line 480 positioned on the extending line of the fourth blocking segment 351 are connected to each other, the distance between two adjacent ones of the tenth compensation lines 491 is equal to a distance between two adjacent ones of the eighth compensation lines 480.

In these optional embodiments, in the third region AA2, the tenth compensation lines 491 are arranged on a side of the fourth connection segment 710 away from the sixth connection segment 730, so that a display difference caused when fourth connection segments 710 arranged in the second region TA are more than fourth connection segments 710 arranged in the third region AA2 can be reduced.

Optionally, a width of the tenth compensation line 491 is equal to a width of the fourth connection segment 710, so that the display difference can be further reduced.

Optionally, a distance between the tenth compensation line 491 and the fourth connection segment 710 adjacent to the tenth compensation line 450 is equal to the distance between two adjacent ones of the fourth connection segments 710, so that there is a same distance between the tenth compensation line 491 and the fourth connection segment 710, and the tenth compensation line 491 and the fourth connection segment 710 are arranged on a basis of a same density, so as to further reduce the display difference.

Optionally, the distance between two adjacent ones of the tenth compensation lines 491, the distance between two adjacent ones of the fourth connection segments 710, and the distance between the tenth compensation line 491 and the fourth connection segment 710 adjacent to the tenth compensation line 491 are equal, and the width of the tenth compensation line 491 is equal to the width of the fourth connection segment 710.

In yet some other optional embodiments, the first metal wiring layer 06 further includes a plurality of eleventh compensation lines 492. On a side of the sixth connection segment 730 away from the fourth connection segment 710 in the third region AA2, a distance between two adjacent ones of the eleventh compensation lines 492 is equal to a distance between two adjacent ones of the sixth connection segments 730. Since, in the top view, the position where the sixth connection segments 730 are distributed is the same as the position where the sixth blocking segments 353 are distributed, and the sixth blocking segment 353 and the ninth compensation line 490 positioned on the extending line of the sixth blocking segment 353 are connected to each other, the distance between two adjacent ones of the eleventh compensation lines 492 is equal to a distance between two adjacent ones of the ninth compensation lines 490.

In these optional embodiments, in the third region AA2, the eleventh compensation lines 492 are arranged on a side of the sixth connection segment 730 away from the fourth connection segment 710, so that a display difference caused when sixth connection segments 730 arranged in the second region TA are more than sixth connection segments 730 arranged in the third region AA2 can be reduced.

Optionally, a distance between the eleventh compensation line 492 and the sixth connection segment 730 adjacent to the eleventh compensation line 492 is equal to the distance between two adjacent ones of the sixth connection segments 730, so that there is a same distance between the eleventh compensation line 492 and the sixth connection segment 730, and the eleventh compensation line 492 and the sixth connection segment 730 are arranged on a basis of a same density, so as to further reduce the display difference.

Optionally, the distance between two adjacent ones of the tenth compensation lines 491, the distance between two adjacent ones of the fourth connection segments 710, the distance between the tenth compensation line 491 and the fourth connection segment 710 adjacent to the tenth compensation line 491, the distance between two adjacent ones of the eleventh compensation lines 492, the distance between two adjacent ones of the sixth connection segments 730, and the distance between the eleventh compensation line 492 and the sixth connection segment 730 adjacent to the eleventh compensation line 492 are equal, and the width of the tenth compensation line 491, the width of the fourth connection segment 710, a width of the eleventh compensation lines 492, and a width of the sixth connection segment 730 are equal.

Optionally, the first metal wiring layer 06 further includes a plurality of twelfth compensation lines 493 extending along the first direction X. On two sides of the first region AA1 along the second direction Y, the plurality of twelfth compensation lines 493 are positioned between the fourth connection segment 710 and the sixth connection segment 730, and a distance between two adjacent ones of the twelfth compensation lines 493 is equal to the distance between two adjacent ones of the sixth connection segments 730, so that the display difference can be further reduced.

Optionally, a distance between the twelfth compensation line 493 and the sixth connection segment 730 adjacent to the twelfth compensation line 493 is equal to the distance between two adjacent ones of the sixth connection segments 730, so that the display difference can be further reduced.

Optionally, the distance between two adjacent ones of the sixth connection segments 730 is equal to the distance between two adjacent ones of the fourth connection segments 710, so that the display difference can be further reduced.

The above embodiments may be combined with each other where possible.

The embodiments of the present application further provide a display panel including the array substrate according to any of the above embodiments. Optionally, the display panel includes the array substrate according to any of the above embodiments and a light emitting layer positioned on the array substrate. In an example, the light emitting layer may be an organic light emitting layer, that is, the display panel may be an organic light emitting diode (OLED) display panel.

The principle of the display panel solving the problem is similar to that of the array substrate described above, and therefore the implementation of the display panel can be referred to the implementation of the array substrate described above, which will not be repeated here.

The embodiments of the present application further provide a display apparatus including the display panel as described in the above embodiments. The display apparatus may be any electronic device having a display function such as a mobile phone, a tablet computer, a notebook computer, an electronic book, or a television.

According to the embodiments of present application as described above, these embodiments do not exhaustively describe all the details and do not limit the present application only to be the specific embodiments. Obviously, many modifications and variations can be made according to the above description. These embodiments are selected and particularly described in the specification to better explain the principles and practical applications of the present application, so that a person skilled in the art is able to utilize the present application and make modifications based on the present application. The present application is limited only by the claims and the full scope and equivalents of the claims.

What is claimed is:

1. An array substrate, wherein the array substrate comprises a first region and a second region surrounding at least a part of the first region, and the array substrate comprises a substrate and a plurality of metal wiring layers formed on the substrate;

wherein the plurality of metal wiring layers comprises a first metal wiring layer, and the first metal wiring layer is positioned on a side of any of other metal wiring layers away from the substrate; and orthographic projections of at least a part of the other metal wiring layers on the substrate are positioned within an orthographic projection of the first metal wiring layer on the substrate, and the first metal wiring layer is configured to compensate for a density of metal wirings, wherein the other metal wiring layers comprise:

a plurality of first signal lines, wherein at least a part of the plurality of first signal lines each comprise a first segment and a second segment separated by the first region and extending along a first direction;

a plurality of first connection lines positioned in the second region, wherein the plurality of first connection lines is arranged around the first region and each first connection line of the plurality of first connection lines comprises a first connection segment, a second connection segment and a third connection segment connected in sequence, the first connection segment is electrically connected to the first segment, the second connection segment is connected between the first connection segment and the third connection segment, the third connection segment is electrically connected to the second segment, the second connection segment extends along the first direction, and the first connection segment and the third connection segment both extend along a second direction; and wherein the first metal wiring layer comprises a plurality of first compensation lines extending along the first direction, and an orthographic projection of each first compensation line of the plurality of first compensation lines on the substrate is positioned on an extending line of an orthographic projection of the second connection segment on the substrate;

wherein the second direction intersects with the first direction.

2. The array substrate according to claim 1, wherein the first metal wiring layer comprises a first blocking line, and an orthographic projection of the first signal line on the substrate is positioned within an orthographic projection of the first blocking line on the substrate.

3. The array substrate according to claim 1, wherein the other metal wiring layers further comprise:

a plurality of second signal lines, wherein at least a part of the plurality of second signal lines each comprise a third segment and a fourth segment separated by the second connection segment and extending along the first direction, and the orthographic projection of each first compensation line of the plurality of first compensation lines on the substrate is positioned between the orthographic projection of the second connection segment on the substrate and an orthographic projection of at least one of the third segment and the fourth segment on the substrate.

4. The array substrate according to claim 3, wherein the first compensation line comprises a first compensation segment, and an orthographic projection of the first compensation segment on the substrate is positioned between an orthographic projection of the third segment on the substrate and the orthographic projection of the second connection segment on the substrate; and/or the first compensation line comprises a second compensation segment, and an orthographic projection of the second compensation segment on the substrate is positioned between an orthographic projection of the fourth segment on the substrate and the orthographic projection of the second connection segment on the substrate.

5. The array substrate according to claim 3, wherein the first metal wiring layer comprises second blocking lines each comprising a second blocking segment, the orthographic projection of the second connection segment on the substrate is positioned within an orthographic projection of the second blocking segment on the substrate, and the first compensation line and the second blocking segment positioned on an extending line of the first compensation line are connected to each other; and the first metal wiring layer further comprises a plurality of third blocking lines, an orthographic projection of the second signal line on the substrate is positioned within an orthographic projection of the third blocking line on the substrate, and the first compensation line and the third blocking line positioned on the extending line of the first compensation line are connected to each other.

6. The array substrate according to claim 3, wherein the second signal line is a power signal line or a reference voltage line, and the third blocking line and the second signal line are connected to each other.

7. The array substrate according to claim 1, wherein the first metal wiring layer comprises a plurality of second compensation lines, and an orthographic projection of each second compensation line of the plurality of second compensation lines on the substrate is positioned on an extending line of an orthographic projection of the first connection segment on the substrate.

8. The array substrate according to claim 7, wherein the first connection line comprises two of the first connection segments spaced apart along the second direction, the orthographic projection of the second compensation line on the substrate is positioned on a side of an orthographic projection of one of the two first connection segments on the substrate away from an orthographic projection of the other of the two first connection segments on the substrate, and/or the orthographic projection of the second compensation line on the substrate is positioned between orthographic projections of the two first connection segments on the substrate.

9. The array substrate according to claim 7, wherein the first metal wiring layer comprises second blocking lines each further comprising a first blocking segment, the orthographic projection of the first connection segment on the substrate is positioned within an orthographic projection of the first blocking segment on the substrate, and the second compensation line and the first blocking segment positioned on an extending line of the second compensation line are connected to each other.

10. The array substrate according to claim 1, wherein the first metal wiring layer comprises a plurality of third compensation lines, and an orthographic projection of each third compensation line of the plurality of third compensation lines on the substrate is positioned on an extending line of an orthographic projection of the third connection segment on the substrate.

11. The array substrate according to claim 10, wherein the first connection line comprises two of the third connection segments spaced apart along the second direction, the orthographic projection of the third compensation line on the substrate is positioned on a side of an orthographic projection of one of the two third connection segments on the substrate away from an orthographic projection of the other of the two third connection segments on the substrate, and/or the orthographic projection of the third compensation line on the substrate is positioned between orthographic projections of the two third connection segments on the substrate.

12. The array substrate according to claim 10, wherein the first metal wiring layer comprises second blocking lines each further comprising a third blocking segment, the orthographic projection of the third connection segment on the substrate is positioned within an orthographic projection of the third blocking segment on the substrate, and the third compensation line and the third blocking segment positioned on an extending line of the third compensation line are connected to each other.

13. The array substrate according to claim 1, wherein the first metal wiring layer further comprises a plurality of fourth compensation lines extending along the second direction, and the plurality of fourth compensation lines is positioned on a side of the first connection segment away from the third connection segment, a distance between two adjacent ones of the plurality of fourth compensation lines is equal to a distance between two adjacent ones of the first connection segments;

a distance between each fourth compensation line of the plurality of fourth compensation lines and the first connection segment adjacent to each fourth compensation line is equal to the distance between two adjacent ones of the first connection segments;

the first metal wiring layer further comprises a plurality of fifth compensation lines extending along the second direction, and the plurality of fifth compensation lines is positioned on a side of the third connection segment away from the first connection segment, a distance between two adjacent ones of the plurality of fifth compensation lines is equal to a distance between two adjacent ones of the third connection segments; and a distance between each fifth compensation line of the plurality of fifth compensation lines and the third connection segment adjacent to each fifth compensation line is equal to the distance between two adjacent ones of the third connection segments.

14. The array substrate according to claim 13, wherein the first metal wiring layer further comprises a plurality of sixth compensation lines extending along the second direction, the plurality of sixth compensation lines are positioned on two sides of the first region along the second direction, and the plurality of sixth compensation lines are positioned between the first connection segment and the third connection segment, a distance between two adjacent ones of the sixth compensation lines is equal to the distance between two adjacent ones of the third connection segments; and a distance between the sixth compensation line and third connection segment adjacent to the sixth compensation line is equal to the distance between two adjacent ones of the third connection segments.

15. The array substrate according to claim 1, wherein the first signal line is a data signal line;

the first connection segment and the third connection segment are arranged in a same layer; and the first signal line and the first connection line are arranged in a same layer.

16. The array substrate according to claim 1, wherein the other metal wiring layers further comprise:

a plurality of third signal lines extending along the second direction, wherein at least a part of the plurality of third signal lines each comprise a fifth segment and a sixth segment separated by the first region;

at least two drivers configured to transmit control signals to the plurality of third signal lines; and wherein the at least two drivers comprise a first driver and a second driver respectively arranged on two sides of the first region along the second direction, and the first driver is configured to connect the fifth segment, and the second driver is configured to connect the sixth segment.

17. The array substrate according to claim 1, wherein the other metal wiring layers comprise:

a plurality of third signal lines extending along the second direction, wherein at least a part of the plurality of third signal lines each comprise a fifth segment and a sixth segment separated by the first region;

at least one driver configured to transmit control signals to the third signal lines; and wherein the at least one driver is arranged on one side of the second region along the second direction, the other metal wiring layers further comprise second connection lines positioned in the second region, the second connection lines are arranged around the first region and the second connection line comprises a fourth connection segment, a fifth connection segment and a sixth connection segment connected in sequence, the fourth connection segment is electrically connected to the fifth segment, the fifth connection segment is connected between the fourth connection segment and the sixth connection segment, the sixth connection segment is electrically connected to the sixth segment, the fifth connection segment extends along the second direction, and the fourth connection segment and the sixth connection segment extend along the first direction; and the first metal wiring layer further comprises a plurality of seventh compensation lines extending along the second direction, and an orthographic projection of the seventh compensation line on the substrate is positioned on an extending line of an orthographic projection of the fifth connection segment on the substrate.

18. A display panel, comprising the array substrate according to claim 1.

19. A display apparatus, comprising the display panel according to claim 18.

* * * * *